(12) United States Patent
Bredemeier et al.

(10) Patent No.: US 10,728,960 B2
(45) Date of Patent: Jul. 28, 2020

(54) TRANSISTOR WITH INTEGRATED ACTIVE PROTECTION

(71) Applicant: Infineon Technologies AG, Neubiberg (DE)

(72) Inventors: Peter Bredemeier, Pr.-Oldendorf (DE); Jorge Cerezo, Palos Verdes Peninsula, CA (US); Thomas Kimmer, Poertschach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 527 days.

(21) Appl. No.: 15/460,938

(22) Filed: Mar. 16, 2017

(65) Prior Publication Data
US 2018/0270913 A1    Sep. 20, 2018

(51) Int. Cl.
| | | |
|---|---|---|
| *H03K 17/08* | (2006.01) | |
| *H05B 6/06* | (2006.01) | |
| *H01L 27/02* | (2006.01) | |
| *H03K 17/082* | (2006.01) | |
| *H01L 29/739* | (2006.01) | |

(52) U.S. Cl.
CPC ......... *H05B 6/062* (2013.01); *H01L 27/0255* (2013.01); *H03K 17/0828* (2013.01); *H01L 27/0288* (2013.01); *H01L 29/7393* (2013.01); *H03K 2017/0806* (2013.01)

(58) Field of Classification Search
CPC ................ H01L 29/7393; H02M 1/32; H02M 2001/325; G05F 1/571; H02H 3/20
See application file for complete search history.

(56) References Cited

U.S. PATENT DOCUMENTS

| | | | | |
|---|---|---|---|---|
| 4,480,201 A | * | 10/1984 | Jaeschke | H03K 17/0422 327/375 |
| 4,937,697 A | * | 6/1990 | Edwards | H02H 5/044 323/276 |
| 5,479,314 A | * | 12/1995 | Kares | H03K 17/0822 361/18 |
| 6,947,272 B2 | * | 9/2005 | Daniels | H03K 17/0822 361/93.7 |
| 7,929,266 B2 | | 4/2011 | Kandah et al. | |
| 2003/0095365 A1 | * | 5/2003 | Nakatake | H02H 7/122 361/91.1 |
| 2009/0040796 A1 | * | 2/2009 | Lalithambika | H02M 3/33507 363/21.17 |
| 2010/0033136 A1 | | 2/2010 | Yang | |

(Continued)

OTHER PUBLICATIONS

Fairchild Semiconductor, "AN-9012 Induction Heating System Topology Review," © 2000 Fairchild Semiconductor Corporation, Dec. 18, 2013, 13 pages.

(Continued)

*Primary Examiner* — Gary L Laxton
(74) *Attorney, Agent, or Firm* — Slater Matsil, LLP

(57) ABSTRACT

In accordance with an embodiment, a method of operating a transistor includes: switching the transistor on and off based on a control signal; monitoring a voltage of a collector node of the transistor; detecting whether the voltage of the collector node of the transistor is above a first threshold; and after detecting the voltage of the collector node of the transistor above the first threshold, regulating a voltage across a load path of the transistor to a first target voltage.

24 Claims, 16 Drawing Sheets

(56) References Cited

U.S. PATENT DOCUMENTS

| | | |
|---|---|---|
| 2012/0049823 A1 | 3/2012 | Chen |
| 2013/0277362 A1 | 10/2013 | Ribarich et al. |
| 2014/0118874 A1* | 5/2014 | Kandah .............. H03K 17/0826 |
| | | 361/93.1 |
| 2018/0145675 A1* | 5/2018 | Suh ........................ H02H 9/044 |

OTHER PUBLICATIONS

Stmicroelectronics, "VNS3NV04DP-3 OMNIFET II fully autoprotected Power MOSFET," Doc ID 018529 Rev 2, Sep. 2013, pp. 1-21.
"IH Cooker Syetem," Mar. 2016, 1 page.

* cited by examiner

| Status | Pullup-Level(INN) |
|---|---|
| No-Fault | 1,25V — 1,75V |
| OT-Warning | 2,5V — 3,3V |
| OV-Detection | <0,5V |
| OT-Warning + OV-Detection | <0,5V (OV dominates) |
| OT-Shut-Down | <0,5V |

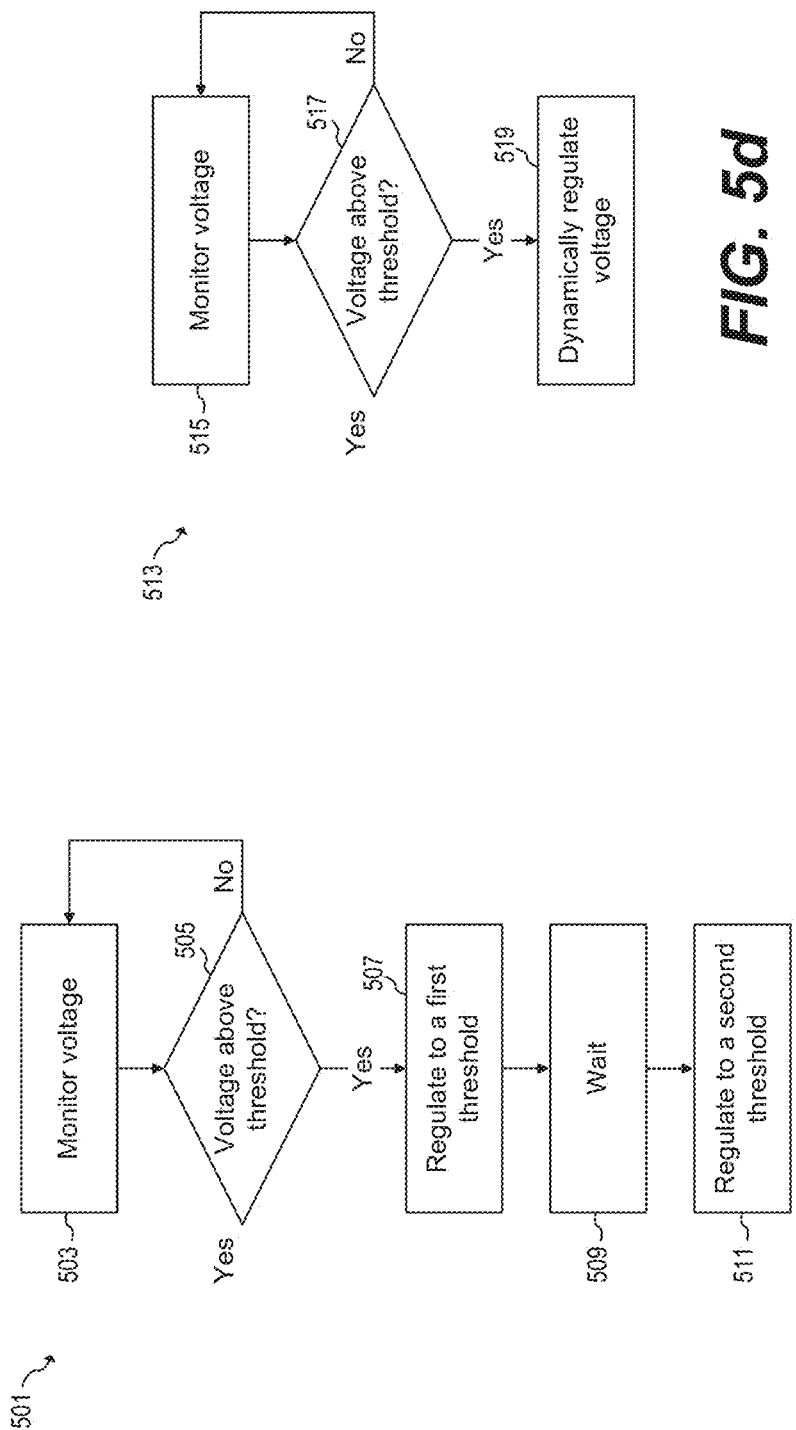

TRANSISTOR WITH INTEGRATED ACTIVE PROTECTION

TECHNICAL FIELD

The present invention relates generally to an electronic circuit, and, in particular embodiments, to a transistor with integrated active protection.

BACKGROUND

Transistor devices are widely used as electronic switches in a variety of different applications, such as industrial, automotive, or consumer applications. Those applications may include power conversion, motor drive, induction heating or lighting applications, to name a few. In many of these applications, a driver switches on and off the transistor device based on a PWM (pulse-width modulated) signal. A frequency of this PWM signal can be dependent on the type of application and/or an operation state of the respective application. For example, in heating applications where a transistor device can be used to drive a heating resistor, a frequency of the PWM signal can be in the tens of Hz; in lighting applications where a transistor device can be used to drive a lamp, such as a light emitting diode (LED), a frequency of the PWM signal can be several hundred Hz; in automotive applications where a transistor device can be used to drive a magnetic valve a frequency of the PWM signal can be several kilohertz (kHz); in motor drive applications where a transistor device can be used to drive a brushed DC motor a frequency of the PWM signal can be several tens of kHz; and in power conversion applications where a transistor device can be used to drive an inductive load (choke) a frequency of the PWM signal can be several tens of kHz up to several hundred kHz.

Transistor devices may be implemented with different technologies. Since each transistor technology generally provides different tradeoff between different performance metrics, size, and cost, the selection of the transistor type may be important. For example, insulated gate bipolar transistors (IGBTs) are generally optimized for high efficiency and switching. IGBTs are also generally capable to operate at very high voltages, with breakdown voltages that reach 1 kV, 1.2 kV or higher.

A technology such as IGBT may be suitable for applications such as induction heating (IH) cookers. IH cookers are very popular, in part, because of their high energy efficiency. To achieve high efficiency, IH cookers may use resonant converter topologies due to the soft switching losses and lower EMI spectrum.

SUMMARY

In accordance with an embodiment, a method of operating a transistor includes: switching the transistor on and off based on a control signal; monitoring a voltage of a collector node of the transistor; detecting whether the voltage of the collector node of the transistor is above a first threshold; and after detecting the voltage of the collector node of the transistor above the first threshold, regulating a voltage across a load path of the transistor to a first target voltage.

BRIEF DESCRIPTION OF THE DRAWINGS

For a more complete understanding of the present invention, and the advantages thereof, reference is now made to the following descriptions taken in conjunction with the accompanying drawings, in which:

FIGS. 5c and 5d illustrate flow charts of embodiment methods of operating an overvoltage protection circuit;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain"

embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, an IGBT with integrated active protection in various implementations and systems. Embodiments of the present invention may be used with other implementations of single-ended parallel resonant topologies, other types of transistors, alternative implementations, and other systems such as a microwave ovens and rice cookers.

In an embodiment of the present invention, an IGBT is integrated with an overvoltage protection circuit, a current limiter circuit and an over-temperature sensor. The integrated temperature sensor is capable of monitoring the junction temperature of the IGBT while the integrated current limiter circuit and overvoltage protection circuit are capable of protecting the IGBT from damage due to an overcurrent or overvoltage condition. The current limiter circuit may be implemented without having the sense resistor in the gate driver loop. The overvoltage protection circuit may be implemented by having a regulation loop that regulates the voltage across the load path of the IGBT when an overvoltage condition is detected. Some embodiments may regulate the voltage across the load path of the IGBT to a fixed target voltage, after an overvoltage condition is detected. Other embodiments may regulate the voltage across the load path of the IGBT dynamically, after an overvoltage condition is detected IH cookers are systems that heat a load, typically a cooking vessel, by providing an AC current through an induction coil. The induction coil induces eddy currents in the cooking vessel, which causes the cooking vessel to heat up. Typically the cooking vessel is built using a material such as iron that produces eddy currents and heat from magnetic fields. The frequency and duty cycle of the AC current may be tuned and optimized to generate heat on a particular type of material. The efficiency of the generation of the AC current may be optimized by using a resonance tank tuned to a particular resonance frequency.

Figure 1:
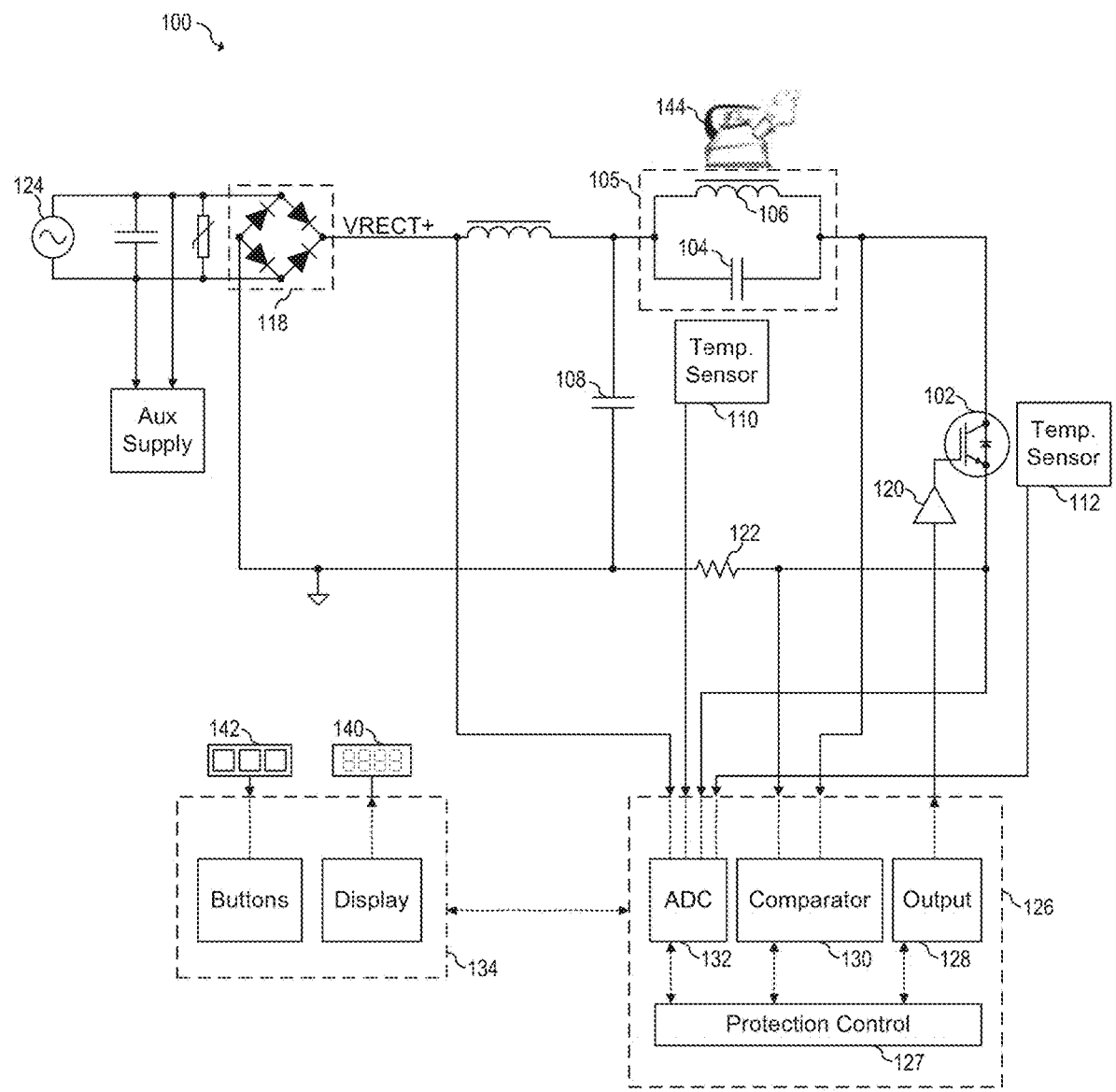
FIG. 1 shows an exemplary IH cooker system, according to an embodiment of the present invention.

FIG. 1 shows exemplary IH cooker system 100, according to an embodiment of the present invention. IH cooker system 100 includes AC power source 124, bridge rectifier 118, resonant tank 105, load 144, IGBT 102, external temperature sensors 110 and 112, gate driver 120, controllers 126 and 134, capacitor 108, and user interfaces 142 and 140. Resonant tank 105 includes resonant inductor 106 and resonant capacitor 104. Controller 126 includes analog-to-digital converter (ADC) 132, comparator block 130, output block 128, and protection control block 127.

During normal operation, bridge rectifier 118 rectifies a voltage provided by AC power source 124. When IGBT 102 is turned on, a current may flow from node VRECT+ through resonant inductor 106 and through a load path of IGBT 102. When IGBT 102 is turned off, the current flowing through resonant inductor 106 flows into resonant capacitor 104 until the current flowing through resonant inductor 106 reaches zero. When the current flowing through resonant inductor reaches zero, a voltage across resonant capacitor 104 is at its maximum for the cycle. After the current flowing through resonant inductor reaches zero, the voltage across resonant capacitor 104 causes a current to flow through resonant inductor 106 in the opposite direction, thereby discharging resonant capacitor 104. Such current may charge capacitor 108 and may recirculate through a diode of IGBT 102, which may reduce a voltage across a load path of IGBT 102. After the voltage across the load path of IGBT 102 is reduced to, for example, zero volts, IGBT 102 may be turned on with zero-voltage switching (ZVS), repeating the sequence.

The current flowing through the load path of IGBT 102 may reach higher peak values when the voltage of node VRECT+ is higher. The peak value of the current flowing through the load path of IGBT 102 when the IGBT 102 is on may determine the peak voltage of resonant capacitor 104 when the IGBT 102 is off. Controlling the maximum peak current flowing through the load path of IGBT 102 when IGBT 102 is on, therefore, may also control the maximum collector-emitter voltage ($V_{ce}$) of IGBT 102 when IGBT 102 is off. Clamping the peak current flowing through IGBT 102 when IGBT 102 is on to a value that results in IGBT 102 being exposed to a $V_{ce}$ lower than IGBT 102's breakdown voltage when IGBT 102 is off may prevent the destruction of IGBT 102. Protection control block 127 may monitor the current flowing through the load path of IGBT 102 by measuring the voltage at a terminal of resistor 122 using ADC 132, monitor the voltage of VRECT+ by using ADC 132, determine a safe maximum value for the peak current flowing through IGBT 102 and turn off IGBT 102 if the safe maximum value for the peak current is exceeded.

Power transfer to load 144 may be controlled, for example, to regulate the temperature of load 144. The power transferred to load 144 is based on the average voltage of node VRECT+ and the average current flowing through the load path of IGBT 102. The voltage of node VRECT+ may vary based on the voltage of AC power source 124. Controller 126 may calculate the power transferred by, for example, multiplying the average current flowing through the load path of IGBT 102 times the average voltage of node VRECT+ and may adjust the on-time of IGBT 102 to achieve a particular power transfer level.

Controller 126 may be configured to regulate the temperature of load 144 to a particular target load temperature. For example, controller 126 may monitor the temperature of the load using temperature sensor 110 via ADC 132 and adjust the on-time of IGBT 102 to achieve the target load temperature. Alternatively, controller 126 may operate in open loop, adjusting the duration IGBT 102 is on based on the target load temperature without monitoring temperature sensor 110. Controller 126 may control the state of IGBT 102 with output block 128 via gate driver 120. Other implementations are also possible.

Controller 134 may provide information to a user via user interface 140, such as current temperature of load 144, and may receive information from a user, such as a target load temperature, via user interface 142. The target load temperature may be supplied to controller 126 such that controller 126 regulates the temperature of load 144 to reach the target load temperature.

Transistors in general, and IGBTs in particular, may get damaged upon the occurrence of overcurrent, overvoltage or over-temperature conditions. To protect against system failure IH cooker system 100 may implement various protection mechanisms. For example, microcontroller 126 may be configured to monitor external temperature sensors 110 and 112 and reduce or stop power transfer when reaching dangerous temperatures at load 144 or IGBT 102 respectively. Back-to-back Zener diodes (not shown) may be placed between a base and a collector terminal of IGBT 102 to clamp a voltage between the base and collector terminals of IGBT 102, thereby clamping the $V_{ce}$ of IGBT 102 during an overvoltage condition. Clamping the $V_{ce}$ of IGBT 102 to a voltage lower than the breakdown voltage of IGBT 102 may prevent the destruction of IGBT 102.

The IGBT breakdown voltage tends to have a positive thermal coefficient. In other words, the hotter the junction temperature of the IGBT, the higher the breakdown voltage and, therefore, the higher the voltage across the load path of IGBT 102 that can be tolerated. Overvoltage protection circuits, therefore, may be designed to dynamically change the clamp voltage based on the temperature of IGBT 102 to optimize system performance. Protection control block 127 may measure the $V_{ce}$ of IGBT 102 via ADC 132 and may control the gate of IGBT 102 via gate driver 120 to regulate the $V_{ce}$ voltage once the $V_{ce}$ voltage exceeds a predetermined threshold.

An external controller may be used to implement controller 126. Since external temperature sensors may not be capable of detecting fast internal temperature changes due to long thermal time constants, controller 126 may be configured to limit power transfer proactively to avoid system failure or damage to IGBT 102 due to an over-temperature condition. Similarly, controller 126 may be configured to activate an overvoltage clamping circuit upon detecting an overvoltage condition. Controller 126 may be further configured to limit the peak current flowing through the load path of IGBT 102, cycle by cycle, to protect IGBT 102 from damage due to excessive current or excessive temperature generated by the current flowing through the load path of IGBT 102. Limiting the current flowing through IGBT 102 also limits the current flowing through resonant inductor 106, thereby limiting the maximum voltage across the load path of IGBT 102 when resonant capacitor 104 is fully charged.

AC Power source 124 is configured to provide power to IH cooker system 100. AC power source may provide a high-line power of 230 $V_{rms}$ and 50 Hz, or a low-line power of 110 $V_{rms}$ and 60 Hz. Other voltages and frequencies may be used. In various embodiments, AC power source 124 represents, for example, an AC voltage generator such as a power invertor, or a power grid that provides and AC line voltage.

Bridge rectifier 118 is configured to rectify the signal from AC power source 124. Bridge rectifier 118 is implemented with four diodes. Alternatively, synchronous rectification may be used. Any other rectification mechanism known in the art may also be used.

Temperature sensors 110 and 112 are external temperature sensors configured to monitor a temperature and communicate it to an external circuit, such as a controller. Temperature sensors 110 and 112 may be implemented using thermistors. Temperature sensor 112 may be integrated together with IGBT 102. Other implementations are possible.

Load 144 is the load to be heated and is typically a cooking vessel. Any load containing material that responds to induction heating may be used.

Resonant tank 105 may be implemented with resonant inductor 106 and resonant capacitor 104. Resonant inductor 106 may be implemented with an induction coil. Alternatively, resonant inductor may be implemented with any inductive element known in the art. The inductance of resonant inductor 106 and the capacitance of resonant capacitor 104 may be selected such that resonant tank 105 resonates at a particular frequency. The frequency may be selected such that the energy transfer from resonant inductor 106 to load 144 is efficient. Since tolerances, parasitic impedances and the type and placement of load 144 may impact the optimum frequency, it may be sufficient to resonate the resonant tank near the optimum frequency to derive efficiency gains. For example, in a system that exhibits efficient energy transfer to load 144 at a frequency of 24 kHz, resonant capacitor 104 may be selected to have a capacitance of 300 nF and resonant inductor 106 may be selected to have an inductance value of 110 µH. Other values may be used.

Output block 128 is configured to control the gate of IGBT 102 via gate driver 120. Output block 128 may be implemented with an input/output (I/O) circuit, pulse width modulation (PWM) circuit, digital-to-analog converter (DAC) or with any other implementation known in the art.

Gate driver 120 is configured to control the gate of IGBT 102. Gate driver 120 may be implemented with an open-loop implementation in any way known in the art. Alternatively, gate driver 120 may be implemented with a closed-loop implementation, such as with a voltage regulator. In some embodiments, gate driver 120 is implemented with an open-loop mode and a closed-loop mode, where the mode is selectable based on the $V_{ce}$ of IGBT 102. Other implementations are also possible.

User interfaces 140 and 142 are configured to provide and receive information from a user, respectively. User interface 142 may be implemented with mechanical buttons or a touch interface. Other implementations are also possible. User interface 140 may be a visual display, a speaker, a device capable of providing haptics feedback, a combination thereof or any other user interface known in the art.

In some embodiments of the present invention, an IGBT, a current limiter circuit, an overvoltage protection circuit and a temperature sensor are integrated in a six-pin package. The protection mechanisms operate independently of an external controller and the IGBT is controllable with a control pin, which may also be used to communicate the fault status of the IGBT with an external circuit.

Figure 2A:
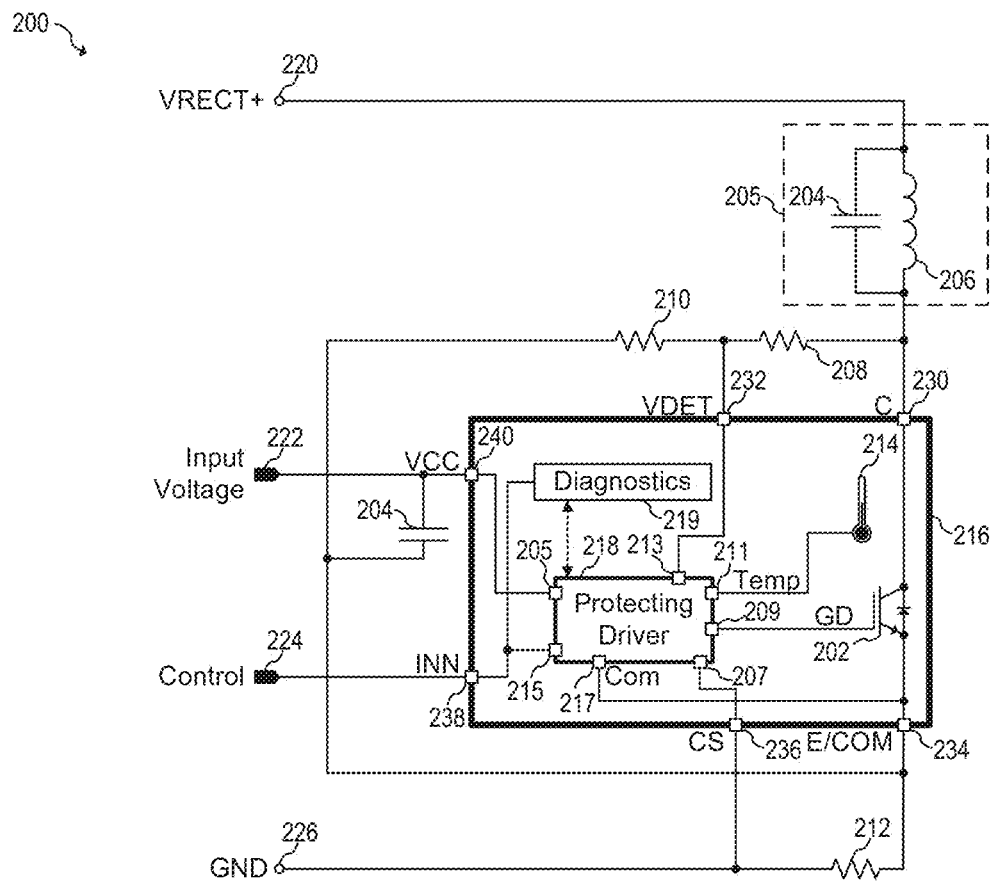
FIG. 2a shows a protected IGBT in and IH cooker subsystem, according to an embodiment of the present invention.

FIG. 2a shows protected IGBT 216 in IH cooker subsystem 200, according to an embodiment of the present invention. IH cooker subsystem 200 includes resonant tank 205, protected IGBT 216, resistors 208 and 210, sense resistor 212, and capacitor 204. Protected IGBT 216 includes IGBT 202, temperature sensor 214, diagnostics block 219, and protecting driver 218.

IH cooker subsystem 200 may receive power through a power source (not shown) connected to a bridge rectifier (not shown) connected to terminals 220 and 226. During normal operation, a controller (not shown) may turn on and off IGBT 202 via control signal 224 to resonate resonant tank 205 in a similar manner as described with reference to IH cooker system 100. For example, an external open-drain driver (not shown) may be used to externally control INN terminal 238 such that when the external open-drain driver pulls INN terminal 238 low, IGBT 202 turns on, and when the external open-drain driver is off, INN terminal 238 is internally pulled up and IGBT 202 turns off. Other implementations for controlling IGBT 202 are also possible.

Protecting driver 218 may control a gate of IGBT 202 as well as may protect IGBT 202 against damage. Protecting driver 218 includes six terminals: C terminal 230 is connected to a collector terminal of IGBT 202. E/COM terminal 234 is connected to an emitter terminal of IGBT 202 as well as to a common terminal (Com) 217 of protecting driver 218. INN terminal 238 is connected to INN terminal 215 of protecting driver 218 and to diagnostics block 219 and may receive a control signal to control whether IGBT 202 is on or off as well as may provide a signal with diagnostics information. VCC terminal 240 receives the power used to power protected IGBT 216. CS terminal 236 is used to monitor the current flowing through the load path of IGBT 216. VDET terminal 232 is used to monitor the voltage across the load path of IGBT 202 and may also be used to monitor the voltage between the collector terminal and the gate terminal of IGBT 202. Some embodiments may implement protecting driver 218 with more terminals. Other embodiments may integrate or remove some of the features of protecting driver 218 to achieve a lower terminal count.

Protecting driver 218 may implement multiple protection features. For example, protecting driver 218 may include a current limiting mechanism that limits the maximum current flowing through a load path of IGBT 202. Protecting driver 218 may also include overvoltage detection and protection, which may limit the voltage across the load path of IGBT 202. Protecting driver 218 may further include over-temperature protection, which may warn and/or shutdown IGBT 202, or protected IGBT 216 due to overheating. Some embodiments may configure protected IGBT 216 in a low power mode to avoid damage due to overheating.

Diagnostics block 219 is configured to provide diagnostic information to an external circuit, such as a controller, regarding the status of protected IGBT 216. The diagnostic information may include whether a fault has occurred or not, and if a fault has occurred, which fault occurred.

Diagnostic block 219 may communicate with an external circuit (not shown) through INN terminal 238. For example, when an external open drain driver controlling INN terminal 238 is off, diagnostic block may pull up the voltage of INN terminal 238 to a different voltage depending on whether there is a fault or not, and if there is a fault, a different type of voltage depending on which fault is present. Diagnostic block 219 may communicate with an external circuit in other ways known in the art, such as by using communications protocols such as I²C, SPI, or other protocols.

Protected IGBT 216 may be integrated in a single chip, such as a six-pin package. Different number of pins may also be used. For example, protected IGBT 216 may share a substrate and may be implemented in a monolithic integrated circuit on a single semiconductor substrate. Protected IGBT 216 may also be implemented in a multi-chip package containing one or more semiconductor dies. Some embodiments may integrate all components of protected IGBT 216. Other embodiments may integrate only some of the components, such as temperature sensor 214 and IGBT 202. Yet other embodiments may integrate resonant tank 205 and external resistors and capacitors. The controller circuit providing control signal 224, the bridge rectifier coupled to terminals 220 and 226 and other components may also be integrated.

Temperature sensor 214 is configured to monitor a junction temperature of IGBT 202. Temperature sensor 214 may be implemented in the same substrate of IGBT 202 and may be implemented as a diode connected to a circuit that monitors a current flowing through a diode and comparing it to a threshold or set of thresholds. Having temperature sensor 214 implemented in the same substrate of IGBT 202 has the advantage of exhibiting fast response time since there may be little or no thermal resistance between the temperature sensor and IGBT 202. Alternatively, temperature sensor 214 may be implemented in a different substrate inside the package, and may be thermally coupled to IGBT 202.

As shown in FIG. 2a, IGBT 202 is an n-type transistor. In embodiments of the present invention, IGBT 202 may be implemented using transistors of the n-type or p-type, including, but not limited to IGBTs, silicon carbide (SiC) junction field-effect transistors (JFET), gallium nitride (GaN) high electron mobility transistor (HEMT), and power metal oxide semiconductor field effect transistors (MOSFETs). The selection of which transistor to use may be made according to the specifications, current, voltage and power levels of the particular system being designed and appropriate adjustments to the circuit may be made to accommodate the particular device type.

Advantages of some embodiments of the present invention include that by integrating temperature sensor 214 with protecting driver 218 and IGBT 202, response time to fault condition is reduced, thereby increasing the robustness of the system. An additional advantage includes that an integrated solution may effectively protect IGBT 202 without relying on an external controller, which may simplify system design and reduce system costs. The increased reliability of the integrated solution may also decrease faults in the field.

Figure 2B:
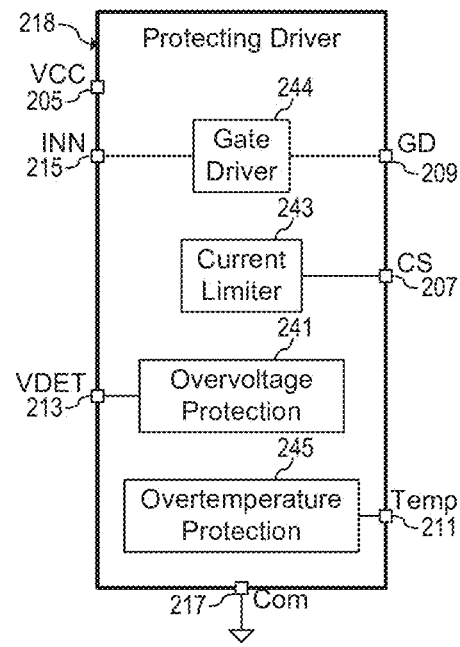
FIG. 2b shows a high level diagram of a protecting driver, according to an embodiment of the present invention.

FIG. 2b shows a high level diagram of protecting driver 218, according to an embodiment of the present invention. Protecting driver 218 includes gate driver 244, current limiter circuit 243, overvoltage protection circuit 241, and over-temperature protection circuit 245. As shown in FIG. 2b, protecting driver 218 also includes VCC terminal 205, INN terminal 215, VDET terminal 213, GD terminal 209, CS terminal 207, Temp terminal 211 and Com terminal 217. Some embodiments of protecting driver 218 may not exhibit physical terminals for terminals 205, 207, 209, 211, 213, 215, and 217. Instead, terminals 205, 207, 209, 211, 213, 215, and 217 may be distinct nodes. Other embodiments may combine some of 205, 207, 209, 211, 213, 215, and 217 terminals or nodes.

Figure 2C:
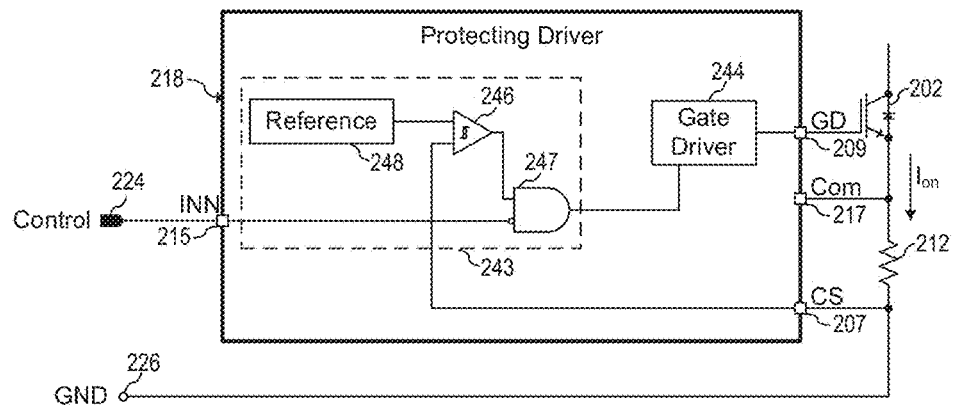
FIG. 2C shows a protecting driver with a diagram of a current limiter circuit, according to an embodiment of the present invention.

FIG. 2c shows protecting driver 218 with a diagram of current limiter circuit 243, according to an embodiment of the present invention. Current limiter circuit 243 includes reference voltage generator 248, comparator 243, and logic gate 247. During normal operation, control signal 224 controls whether IGBT 202 is on or off while current limiter circuit 243 senses a current flowing through a load path of IGBT 202 via sense resistor 212. When a current flowing through the load path of IGBT 202 exceeds a predetermined threshold, IGBT 202 is turned off independent of control signal 224. For example, as shown in FIG. 2c, comparator 246 is configured to change state when a voltage at node CS crosses a reference voltage produced by reference voltage generator 248. When an output of comparator 248 is high, gate driver 244 turns on IGBT 202 when INN terminal is low and turns off IGBT 202 when INN terminal is high. When the output of comparator 248 is low, IGBT 202 is turned off independent from the voltage at the INN terminal.

The common voltage or ground reference of protecting driver 218 is provided by Com terminal 217. Since Com terminal 217 is connected to the emitter node of IGBT 202 and since the current flowing through the load path of IGBT 202 when IGBT 202 is on flows from the collector of IGBT to the emitter of IGBT 202 towards terminal 226, the voltage sensed at node CS may be negative. The voltage sensed at node CS, therefore, may be offset by a positive voltage (not shown) and then compared by comparator 246 to a positive threshold generated by reference generator 248. For example, the voltage at node CS may be added to a 2.5 V offset voltage and compared to a reference of 2 V. Alternatively, reference voltage generator 248 may generate a negative reference voltage by using, for example, an external negative reference, or a negative charge pump. Other implementations are also possible.

As shown in FIG. 2c, sense resistor 212 is outside the gate driver loop. In other words, gate driver 244 produces a voltage at GD terminal 209 that is referenced to com terminal 217, which is connected the emitter of IGBT 202, thereby directly controlling the gate-emitter voltage $V_{ge}$ of IGBT. Gate driver 244, therefore, may control $V_{ge}$ of IGBT 202 independent of the amount of current flowing through sense resistor 212, making the switching of IGBT 202 more efficient. Reducing the resistance of the gate driver loop may also result in faster response times for turning on and off IGBT 202.

As shown in FIG. 2c, logic gate 247 is an AND gate with an inverted input and a non-inverted input and comparator 246 is a Schmitt trigger comparator. It is understood that logic gate 247, comparator 246 and reference voltage generator 248 may be implemented in any way known in the art.

Figure 2D:
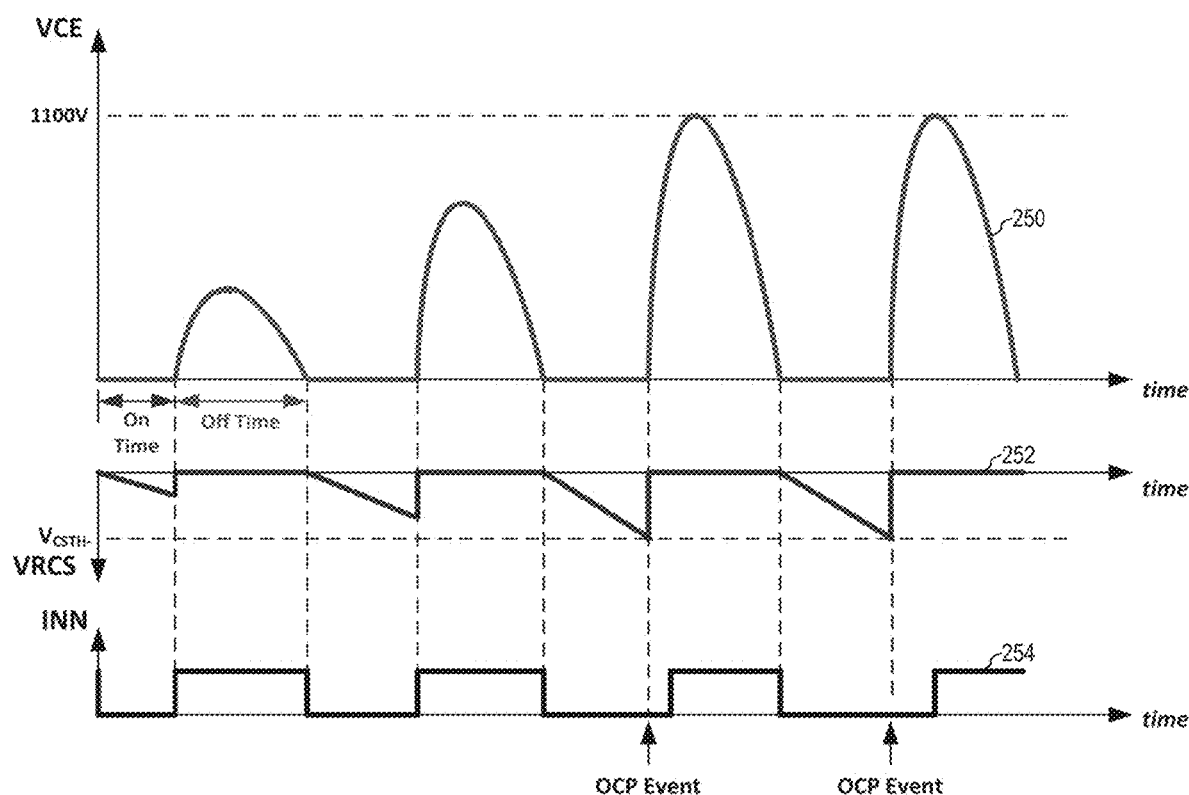
FIG. 2d shows waveforms of an IH cooker subsystem, according to an embodiment of the present invention.

FIG. 2d shows waveforms of IH cooker subsystem 200, according to an embodiment of the present invention. Curve 250 illustrates the voltage across the load path of IGBT 202, also known as the collector-emitter voltage or $V_{ce}$, curve 252 illustrates the voltage of CS terminal 207, which represents the current flowing through the load path of IGBT 202, and curve 254 illustrates the voltage of INN terminal 215, which represents control signal 224.

During normal operation, when the voltage of INN terminal 215 is low, the $V_{ce}$ of IGBT 202 is low since IGBT is on, and current flows through the load path of IGBT 202, as can be seen in curves 254 and 252, and 250. When the voltage of INN terminal 215 is high, current stops flowing through the load path of IGBT 202 since IGBT 202 is off and the $V_{ce}$ of IGBT 202 increases and decreases based on the resonant tank.

As shown in FIG. 2d, the higher the peak current of the current flowing through the load path of IGBT 202 while IGBT 202 is on, the higher the $V_{ce}$ of IGBT 202 when IGBT 202 is off. Limiting the current flowing through the load path of IGBT 202 cycle by cycle, therefore, may also limit the maximum $V_{ce}$ of IGBT 202.

Figure 2E:
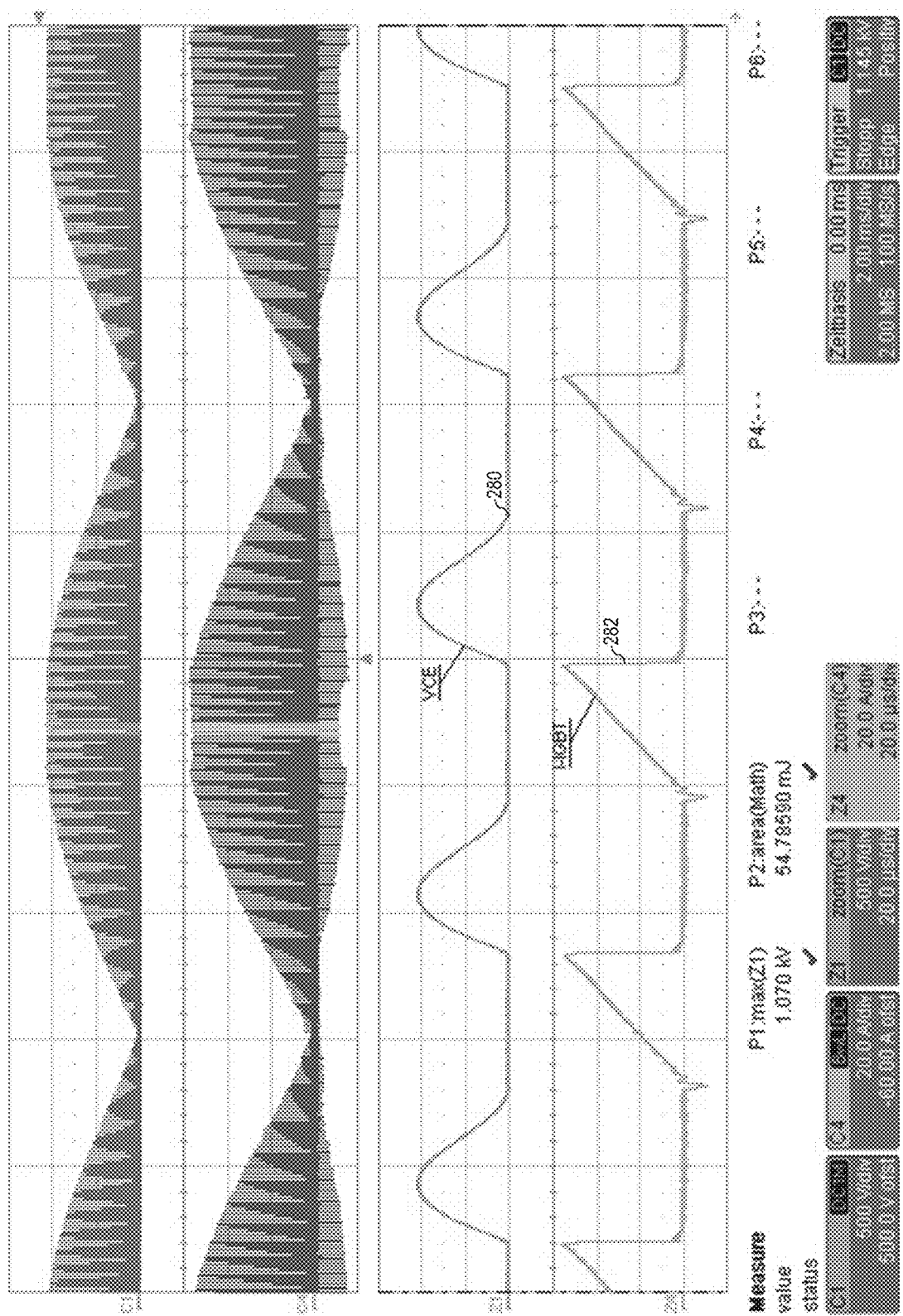
FIGS. 2e and 2f show waveforms of $V_{ce}$ and current across the load path of IGBT 202 with two different AC input voltages, according to an embodiment of the present invention.
Figure 2F:
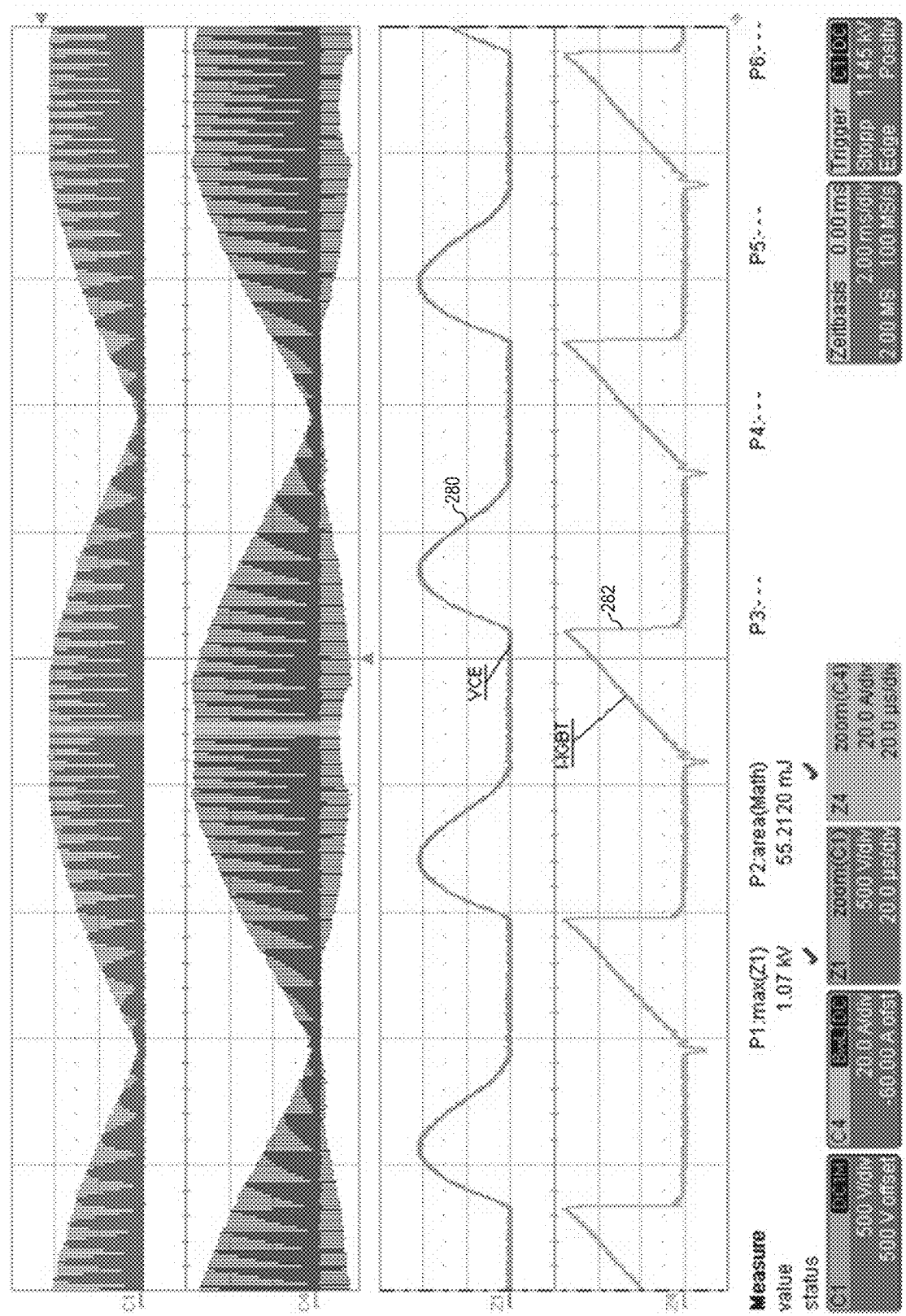

FIGS. 2e and 2f show waveforms of $V_{ce}$ and current across the load path of IGBT 202 with two different AC input voltages, according to an embodiment of the present invention. Curve 280 illustrates the $V_{ce}$ of IGBT 202, and curve 282 illustrates the current across the load path of IGBT 202. FIG. 2e illustrates waveforms with an AC input voltage of 230 $V_{rms}$. FIG. 2f illustrates waveforms with an AC input voltage of 260 $V_{rms}$. As shown by curve 280 of FIGS. 2e and 2f, the maximum $V_{ce}$ of IGBT 202 is the same, at 1.07 kV, independent of the AC input voltage due to the cycle-by-cycle current limit.

Figure 2G:
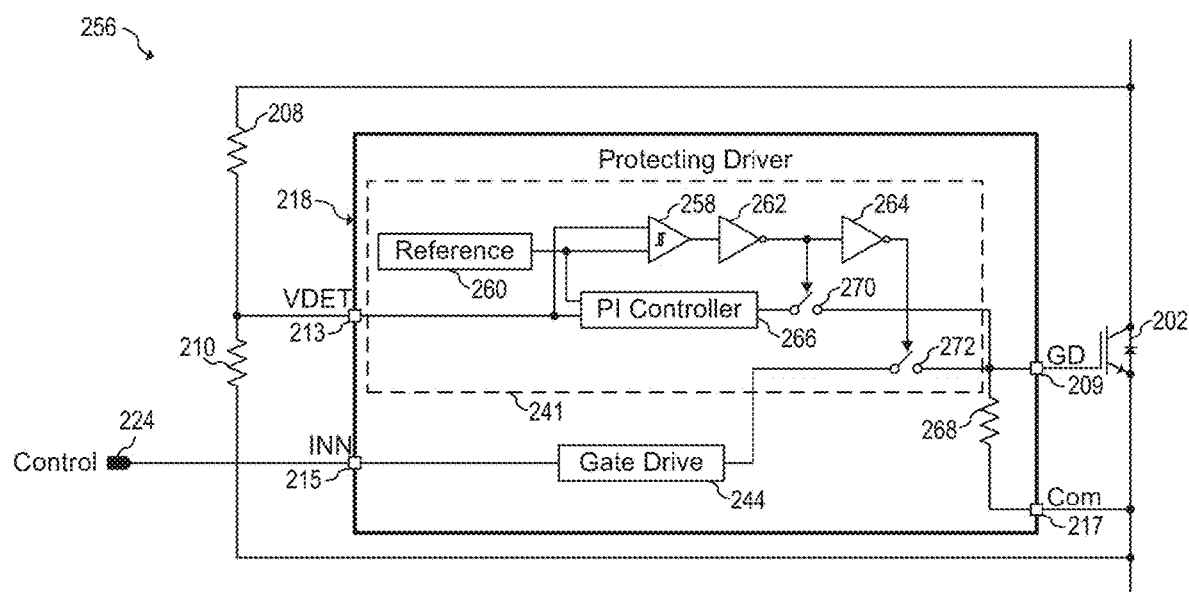
FIG. 2g shows a protecting driver with a diagram of an overvoltage protection circuit, according to an embodiment of the present invention.

FIG. 2g shows protecting driver 218 with a diagram of overvoltage protection circuit 241, according to an embodiment of the present invention. Overvoltage protection circuit 241 includes reference voltage generator 260, proportional integral (PI) controller 266, comparator 258, inverters 262 and 264, and switches 270 and 272. During normal operation, switch 272 is closed, switch 270 is open, and control signal 224 controls whether IGBT 202 is on or off while overvoltage protection circuit 241 monitors the voltage of a collector node of IGBT 202 by monitoring the voltage of VDET terminal 213. Resistors 208 and 210 divide down the voltage of the collector node of IGBT 202. Since resistor 210 is coupled between VDET terminal 213 and Com terminal 217, the voltage of VDET terminal 213 is also a measure of the $V_{ce}$ of IGBT 202.

When the $V_{ce}$ voltage of IGBT 202 exceeds a predetermined threshold, switch 270 is closed, switch 272 is open and PI controller 266 controls the gate of IGBT 202 to regulate the voltage to a predetermined target voltage. By regulating the $V_{ce}$ voltage of IGBT 202, some current flows through the load path of IGBT 202 without fully discharging resonant tank 205. It is understood that when the overvoltage condition disappears or enough of the excess energy produced by the overvoltage condition is dissipated, PI controller 266 may not be able to regulate the $V_{ce}$ of IGBT 202 up to the predetermined target. At that point, however, there may not be a need for regulating the $V_{ce}$ of IGBT 202 since the risk of damage to IGBT 202 due to an overvoltage condition has been reduced or eliminated.

Figure 2H:
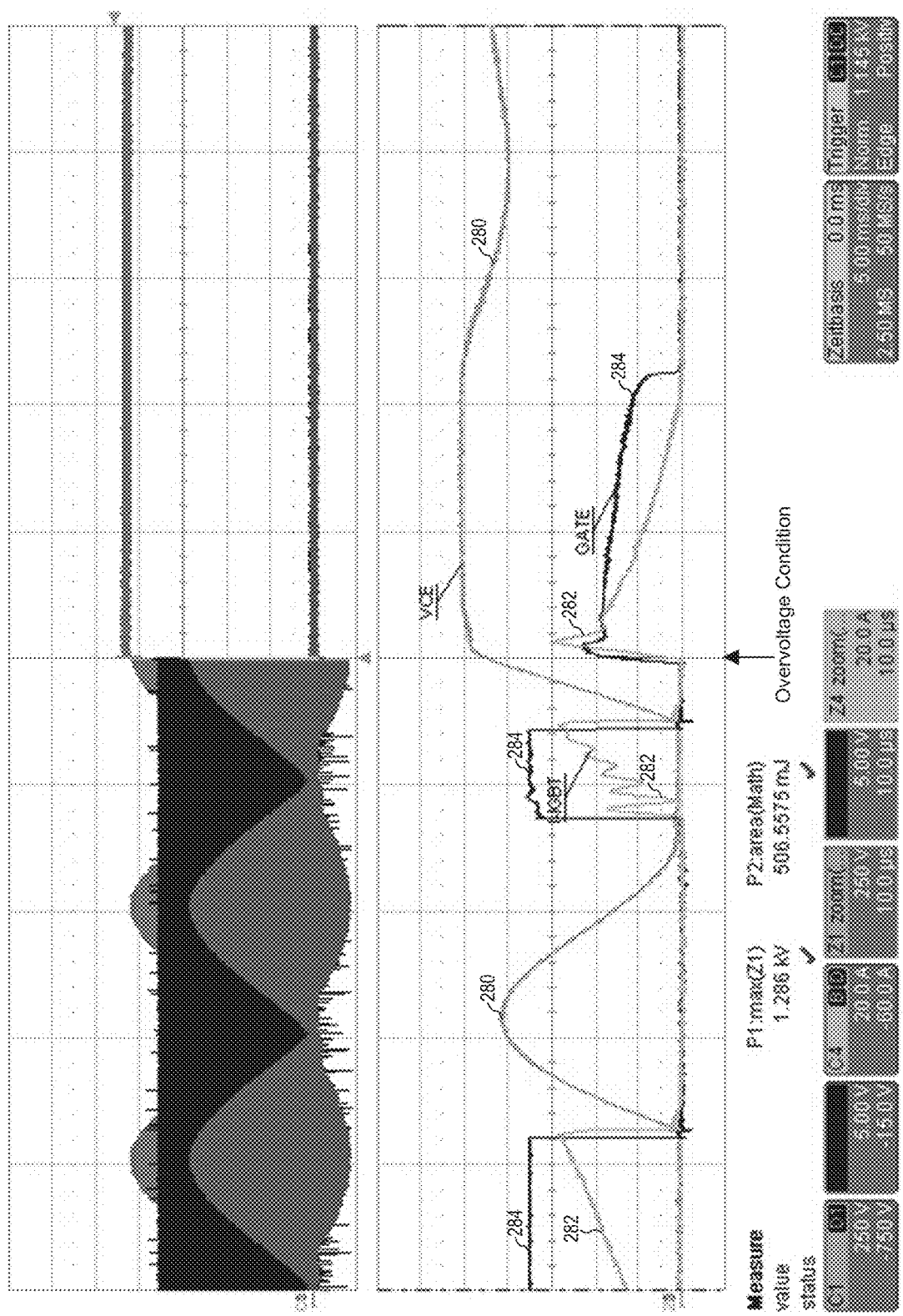
FIG. 2h shows $V_{ce}$ of an IGBT, current across the load path of the IGBT, and the voltage of the gate of the IGBT during an overvoltage condition, according to an embodiment of the present invention.

FIG. 2h shows $V_{ce}$ of IGBT 202, current across the load path of IGBT 202, and the voltage of the gate of IGBT 202 during an overvoltage condition, according to an embodiment of the present invention. Curve 280 illustrates the $V_{ce}$ of IGBT 202, curve 282 illustrates the current across the load path of IGBT 202, and curve 284 illustrates the voltage of the gate of IGBT 202. As shown by FIG. 2h, when an overvoltage even occurs, the gate of IGBT 202 turns on to regulate the $V_{ce}$ voltage, thereby clamping the voltage across the load path of IGBT 202. Current flows through the load path of IGBT 202 during the regulation process, as shown by curve 282. The total energy dissipated during the clamping process in the overvoltage event illustrated in FIG. 2h is about 500 mJ.

Figures 2I, 2J:
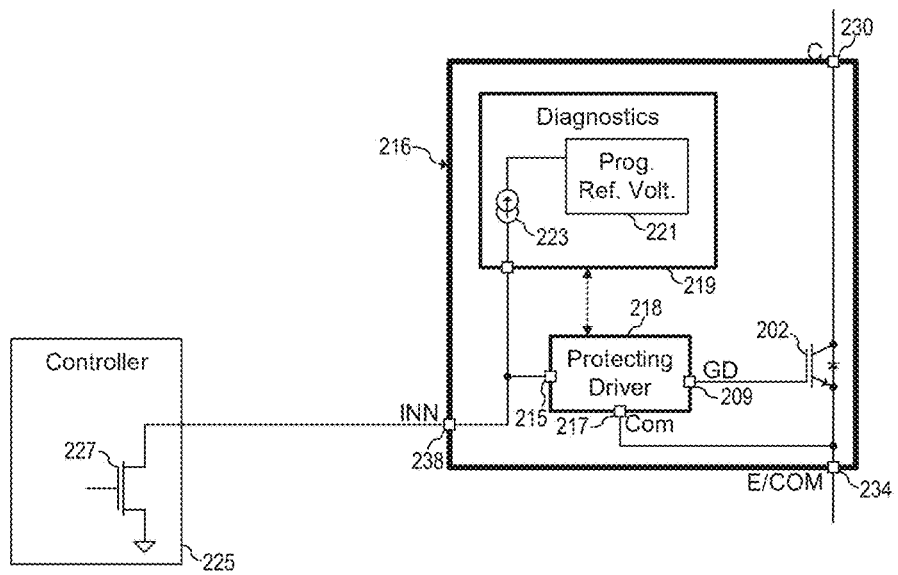
FIG. 2i shows a protected IGBT with a diagram of a diagnostics circuit, according to an embodiment of the present invention.
FIG. 2j shows a table with voltage ranges and fault types, according to an embodiment of the present invention.

FIG. 2i shows protected IGBT 216 with a diagram of diagnostics circuit 219, according to an embodiment of the present invention. Diagnostics circuit 219 includes current source 223, and programmable reference voltage generator 221. Controller 225 with transistor 227 in open drain configuration is connected to INN terminal 238 to control IGBT 202. When transistor 227 turns on, the voltage of INN terminal 238 is at or near zero volts, thereby turning on IGBT 202. When transistor 227 is off, current source 223 pulls up the voltage of INN terminal 238 to a voltage given by programmable reference voltage 221. The current of current source may be selected such that is small enough to be overpowered by transistor 227 when transistor 227 is on.

The voltage given by programmable reference voltage 221 may depend on whether there is a fault in protected IGBT 216, and in the type of fault present. For example, FIG. 2j shows a table with voltage ranges and fault types, according to an embodiment of the present invention. As shown in FIG. 2j, an external circuit may interpret a voltage of INN terminal 238 in the range between 1.25 V and 1.75 V as a no fault condition. Similarly, an external circuit may interpret a voltage of terminal INN in the range between 2.5 V and 3.3 V as an over-temperature warning, and a voltage of terminal INN below 0.5 V as either an overvoltage detection or an over-temperature shutdown. Other voltages may be used and different types of faults may be communicated via INN terminal 238.

Programmable reference voltage generator 221 may generate a voltage according to FIG. 2j. Programmable reference voltage generator 221 may be implemented with a digital-to-analog converter (DAC), or in any other way known in the art.

Current source 223 may be implemented by a resistor. Other implementations are also possible.

Figure 2K:
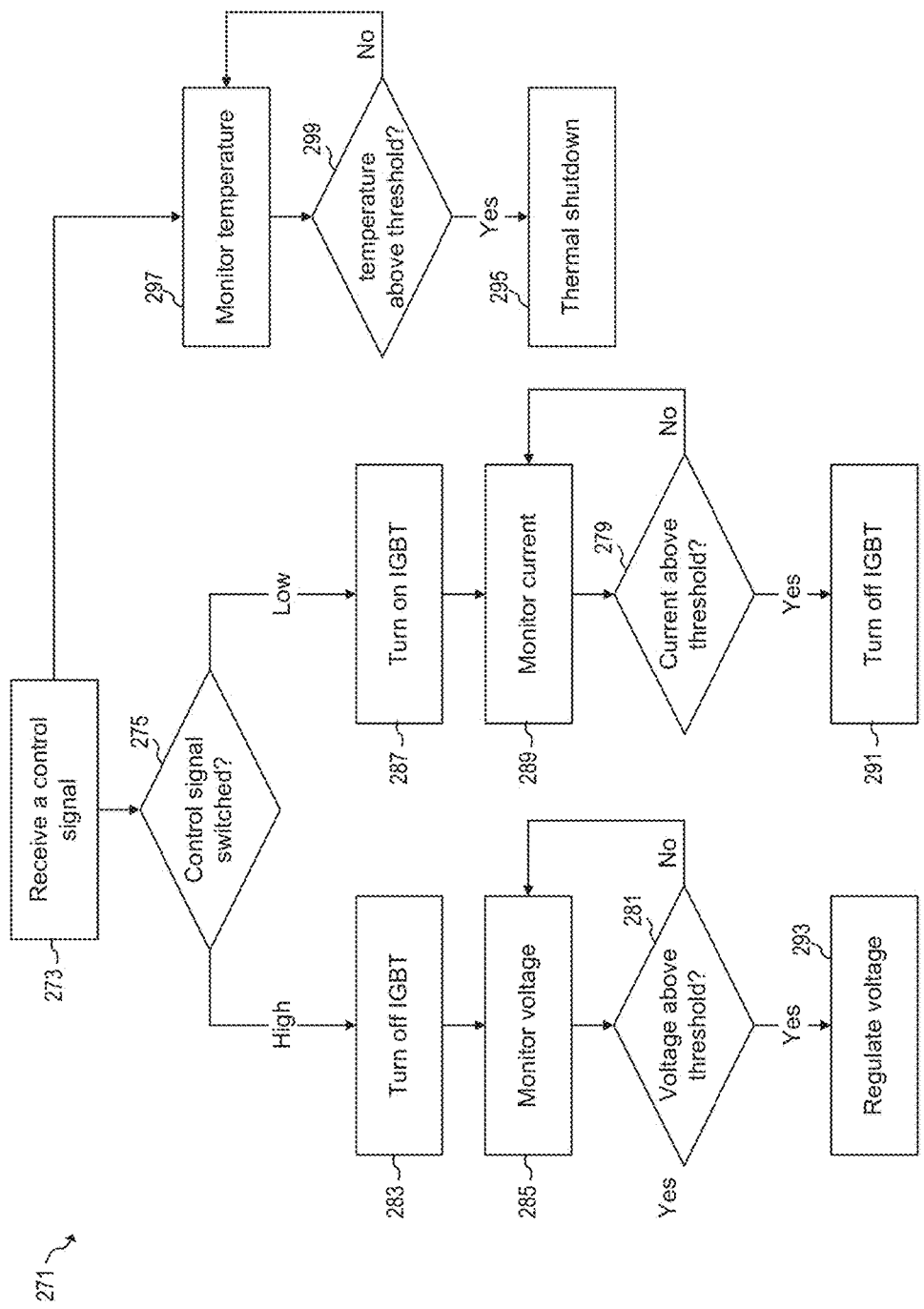
FIG. 2k illustrates a flow chart of an embodiment method of operating an IGBT transistor.

FIG. 2k illustrates a flow chart of embodiment method 271 of operating an IGBT transistor. Method 271 may be implemented in IH cooker subsystem 200, but it may also be implemented in other applications, with other transistor types and in other ways known in the art. The discussion that follows assumes that IH cooker subsystem 200, as shown in FIGS. 2a-2j implement method 271 of operating a protected IGBT transistor.

During step 273, a control signal, such as control signal 224, is received. During step 275, it is determined whether the control signal is high or low. Step 275 may be executed each time the control signal transitions from a first state to a second state. Alternatively, step 275 may be polled periodically.

When the control signal is low, step 287 gets executed. During step 287, the IGBT, such as IGBT 202, is turned on. During step 289, the current flowing through the load path of IGBT 202 is monitored. The current may be monitored by using a sense resistor, such as sense resistor 212. Alternatively, other current monitoring techniques, such as by using current mirrors, current transformers and hall sensors. During step 279, the current flowing through the IGBT is compared with a reference. When the magnitude of the current flowing through the IGBT is greater than the reference, step 291 is executed. During step 291, the IGBT is turned off. Step 279 may be executed periodically. Alternatively, step 279 may asynchronously detect an overcurrent event.

When the control signal is high, step 283 gets executed. During step 283, the IGBT is turned off. During step 285, the voltage at a collector node of the IGBT is monitored. The voltage monitored by using a comparator and a reference voltage generator, such as comparator 258 and reference voltage generator 260. Alternatively other voltage monitoring techniques, such as by using and ADC, may be used. During step 281, the voltage of the collector node of the IGBT is compared with a reference. When the voltage of the collector node of the IGBT is greater than the reference, step 293 is executed. During step 293, the $V_{ce}$ of the IGBT regulated to a target voltage. Step 281 may be executed periodically. Alternatively, step 281 may asynchronously detect an overvoltage condition.

Step 297 may be executed continuously and independent of the state of the control signal. During step 297, the temperature of the IGBT is monitored. The temperature of the IGBT may be sensed by a temperature sensor, such as temperature sensor 214. During step 299, the temperature of the IGBT is compared with a reference. When the temperature of the IGBT is greater than the reference, step 295 is executed. During step 295, the IGBT may be turned off, the system may be shut down or placed in a low power consumption state, or any other mechanism may be executed to reduce or prevent the temperature from increasing to a temperature that may damage the IGBT or other system component. Step 299 may be executed periodically. Alternatively, step 299 may asynchronously detect an overtemperature condition.

Figure 3:
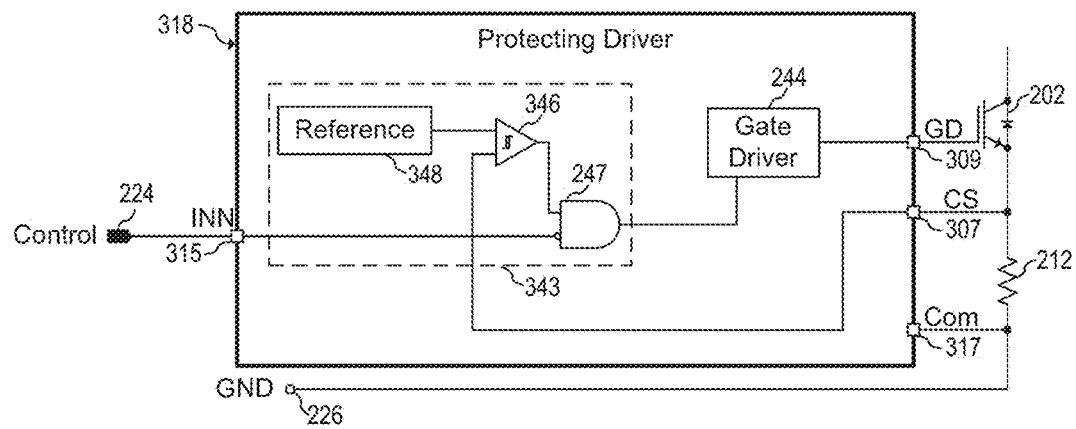
FIG. 3 shows a protecting driver with a diagram of current limiter circuit, according to another embodiment of the present invention.

Alternative implementations of current limiter circuits are also possible. For example, FIG. 3 shows protecting driver 318 with a diagram of current limiter circuit 343, according to an embodiment of the present invention. Current limiter circuit 343 operates in a similar manner as current limiter circuit 243 and may be implemented in a system that also implements other protection mechanisms, such as over-temperature and overvoltage protection circuits. Current limiter circuit 343, however, is implemented with sense resistor 212 connected between Com terminal 317 and the emitter node of IGBT 202, while CS terminal 307 is connected to the emitter node of IGBT 202. Other implementations are also possible.

Figure 4:
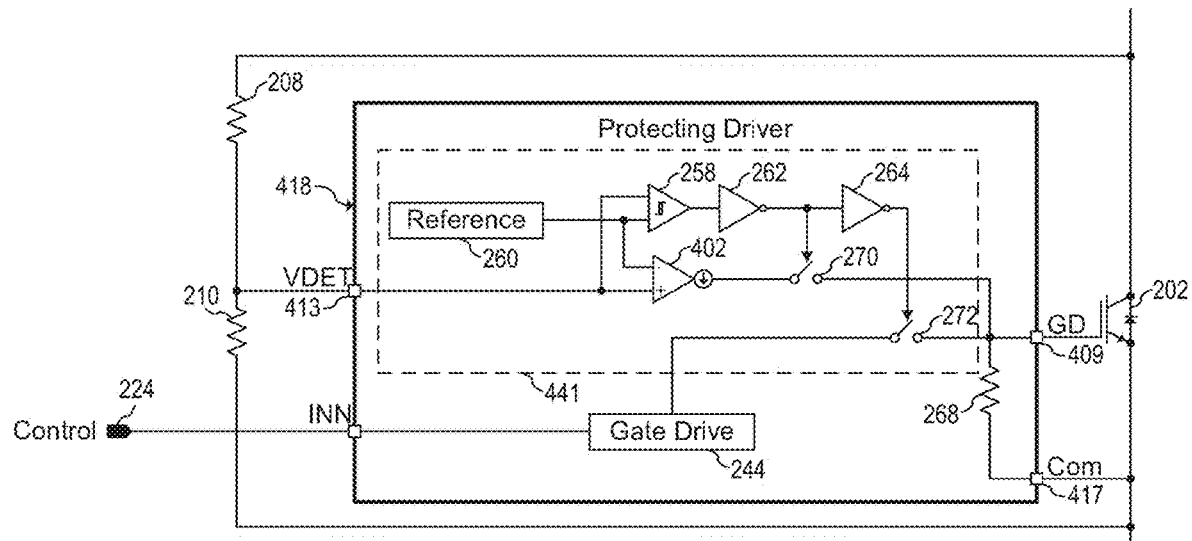
FIG. 4 shows a protecting driver with a diagram of an overvoltage protection circuit, according to another embodiment of the present invention.

Alternative implementations of overvoltage protection circuits are also possible. For example, FIG. 4 shows protecting driver 418 with a diagram of overvoltage protection circuit 441, according to an embodiment of the present invention. Overvoltage protection circuit 441 operates in a similar manner as overvoltage protection circuit 241 and may be implemented in a system that also implements other protection mechanisms, such as over-temperature and current limiter protection circuits. Overvoltage protection circuit 441, however, implements operational transconductance amplifier (OTA) 402 instead of PI controller 266. Other implementations are also possible.

Figure 5A:
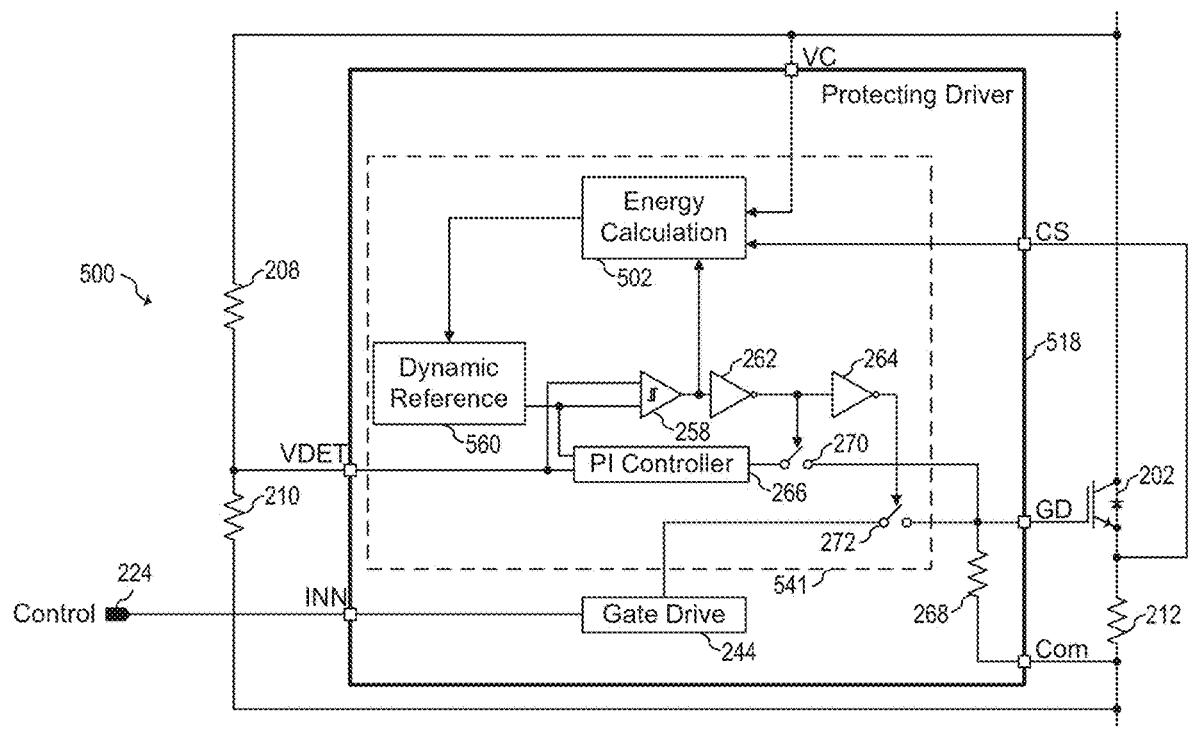
FIG. 5a shows a protecting driver with a diagram of an overvoltage protection circuit 541, according to yet another embodiment of the present invention.

FIG. 5a shows protecting driver 518 with a diagram of overvoltage protection circuit 541, according to an embodiment of the present invention. Overvoltage protection circuit 541 operates in a similar manner as overvoltage protection circuit 241 and may be implemented in a system that also implements other protection mechanisms, such as over-temperature and current limiter protection circuits. Overvoltage protection circuit 541, however, implements dynamic reference voltage generator 560 instead of reference voltage generator 260 and includes energy calculation block 502.

Dynamic reference voltage generator 560 may change the regulation target voltage dynamically to improve the efficiency of the system. For example, upon detection of an overvoltage condition, such as $V_{ce}$ above 1.1 kV, dynamic reference voltage generator 560 may produce a first reference voltage such that overvoltage protection circuit 541 regulates the voltage $V_{ce}$ to a first target voltage, such as 1.1 kV. As current flows through IGBT 202, IGBT 202 heats up, thereby increasing IGBT 202's breakdown voltage due to the positive thermal coefficient. After a period of time, the breakdown voltage of IGBT 202 may be increased to, for example, 1.3 kV. At that time, dynamic reference voltage generator 560 may produce a second reference voltage such that overvoltage protection circuit 541 regulates the voltage $V_{ce}$ to a second target voltage, such as 1.3 kV. By increasing the $V_{ce}$ of IGBT 202, less current flows through the load path of IGBT 202, thereby reducing the power dissipated by the voltage clamping mechanism.

Figure 5B:
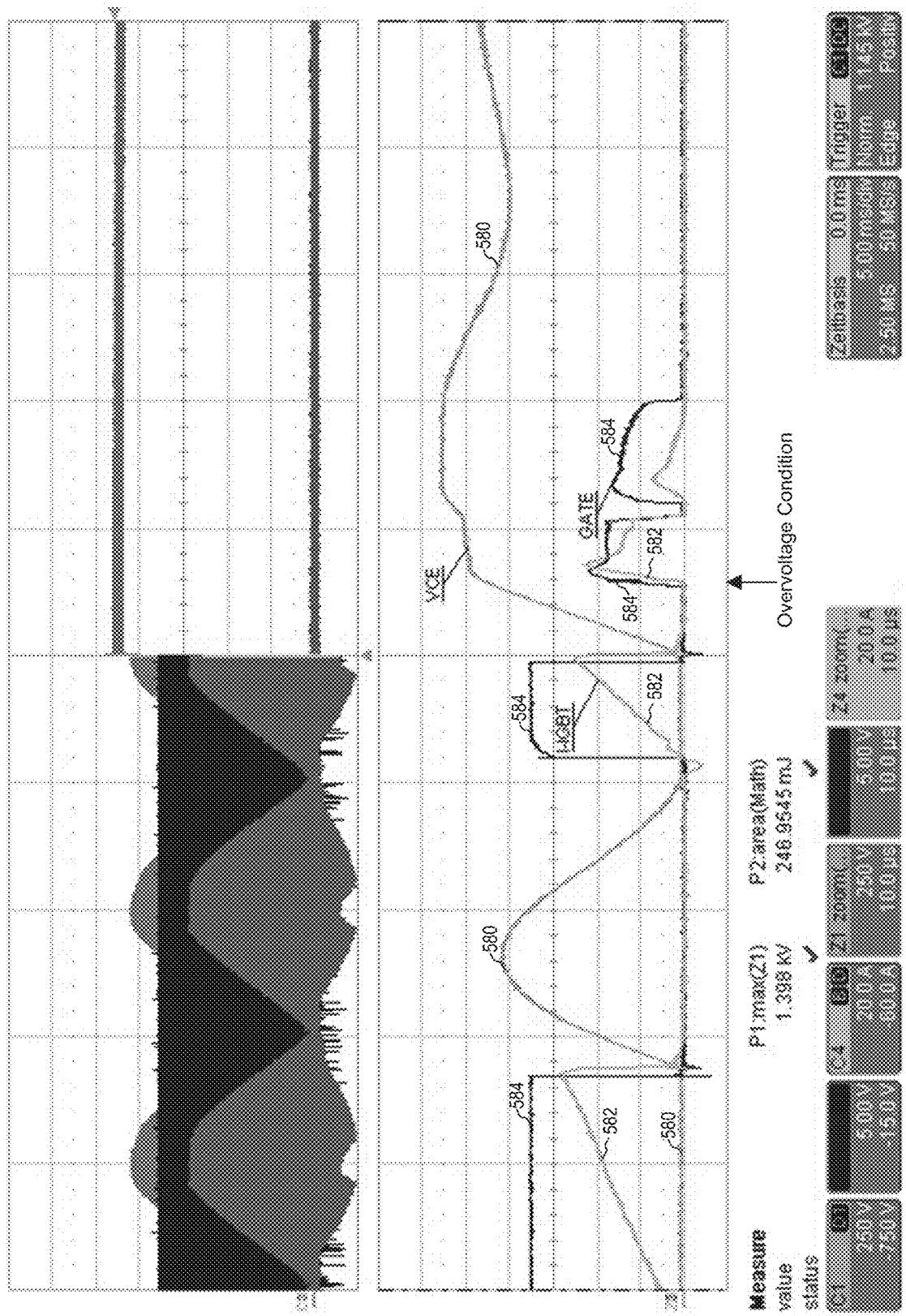
FIG. 5b shows $V_{ce}$ of an IGBT, current across the load path of the IGBT, and the voltage of the gate of the IGBT during an overvoltage condition, according to an embodiment of the present invention.

FIG. 5b shows $V_{ce}$ of IGBT 202, current across the load path of IGBT 202, and the voltage of the gate of IGBT 202 during an overvoltage condition, according to an embodiment of the present invention. Curve 580 illustrates the $V_{ce}$ of IGBT 202, curve 582 illustrates the current across the load path of IGBT 202, and curve 584 illustrates the voltage of the gate of IGBT 202. As shown by FIG. 5b, when an overvoltage even occurs, the gate of IGBT 202 turns on to regulate the $V_{ce}$ voltage to a first target voltage of 1.1 kV based on a first reference voltage generated by dynamic reference voltage generator 560, thereby clamping the voltage across the load path of IGBT 202. A first time after regulating the $V_{ce}$ voltage to 1.1 kV, the reference voltage generated by dynamic reference voltage generator 560 is increased to regulate the $V_{ce}$ voltage to 1.4 kV, thereby reducing the gate voltage of IGBT 202. IGBT 202 remains protected since the breakdown voltage of IGBT 202 increased due to the heat produced by the current flowing through the load path of IGBT 202. The total energy dissipated during the clamping process in the overvoltage event illustrated in FIG. 5b is about 250 mJ, which is about half the energy dissipated in a similar overvoltage event when using a fixed clamping voltage, as illustrated in FIG. 2h.

Other mechanisms for changing the target clamp/regulating voltage may be used. For example, the target regulation voltage may increase linearly with time. Some embodiments may set the target according to a previously characterized behavior of the breakdown voltage of a particular IGBT. Other embodiments may dynamically change the target regulation voltage based on actively monitoring the junction temperature of IGBT 202. Other implementations are also possible.

FIG. 5c illustrates a flow chart of embodiment method 501 of operating an overvoltage protection circuit. Method 501 may be implemented in protecting driver 518, but it may also be implemented in other overvoltage protection circuits, other applications, with other transistor types and in other ways known in the art. The discussion that follows assumes that protecting driver 518, as shown in FIG. 5a implements method 501 operating an overvoltage protection circuit.

During step 503, the voltage at a collector node of an IGBT, such as IGBT 202, is monitored. The voltage may be monitored by using a comparator and a reference voltage generator, such as comparator 258 and reference voltage generator 560. Alternatively other voltage monitoring techniques, such as by using and ADC, may be used. During step 505, the voltage of the collector node of the IGBT is compared with a reference. When the voltage of the collector node of the IGBT is greater than the reference, step 507 is executed. During step 507, the $V_{ce}$ of the IGBT regulated to a first target voltage. During step 509 a wait time elapses. During step 511, the $V_{ce}$ of the IGBT regulated to a second target voltage. The second target voltage may be larger than the first target voltage. Having the second target voltage larger than the first target voltage allows for reduced power dissipation during the clamping process while still protecting the IGBT.

FIG. 5d illustrates a flow chart of embodiment method 513 of operating an overvoltage protection circuit. Method 513 may be implemented in protecting driver 518, but it may also be implemented in other overvoltage protection circuits, other applications, with other transistor types and in other ways known in the art. The discussion that follows assumes that protecting driver 513, as shown in FIG. 5a implements method 501 operating an overvoltage protection circuit.

During step 515, the voltage at a collector node of an IGBT, such as IGBT 202, is monitored. The voltage may be monitored by using a comparator and a reference voltage generator, such as comparator 258 and reference voltage generator 560. Alternatively other voltage monitoring techniques, such as by using and ADC, may be used. During step 517, the voltage of the collector node of the IGBT is compared with a reference. When the voltage of the collector node of the IGBT is greater than the reference, step 519 is executed. During step 519, the $V_{ce}$ of the IGBT regulated dynamically. The regulation voltage may, for example, increase linearly to reduce power dissipation during the clamping process. Some embodiments may perform a real time energy calculation by, for example, using energy calculation block 502, and determine the regulation voltage based on the energy calculated. Other embodiments may change the regulation voltage according to an arbitrary curve. The arbitrary curve may be, for example, obtained by characterizing the breakdown voltages of the IGBT at different temperatures. Other regulation voltages are also possible.

Figure 6:
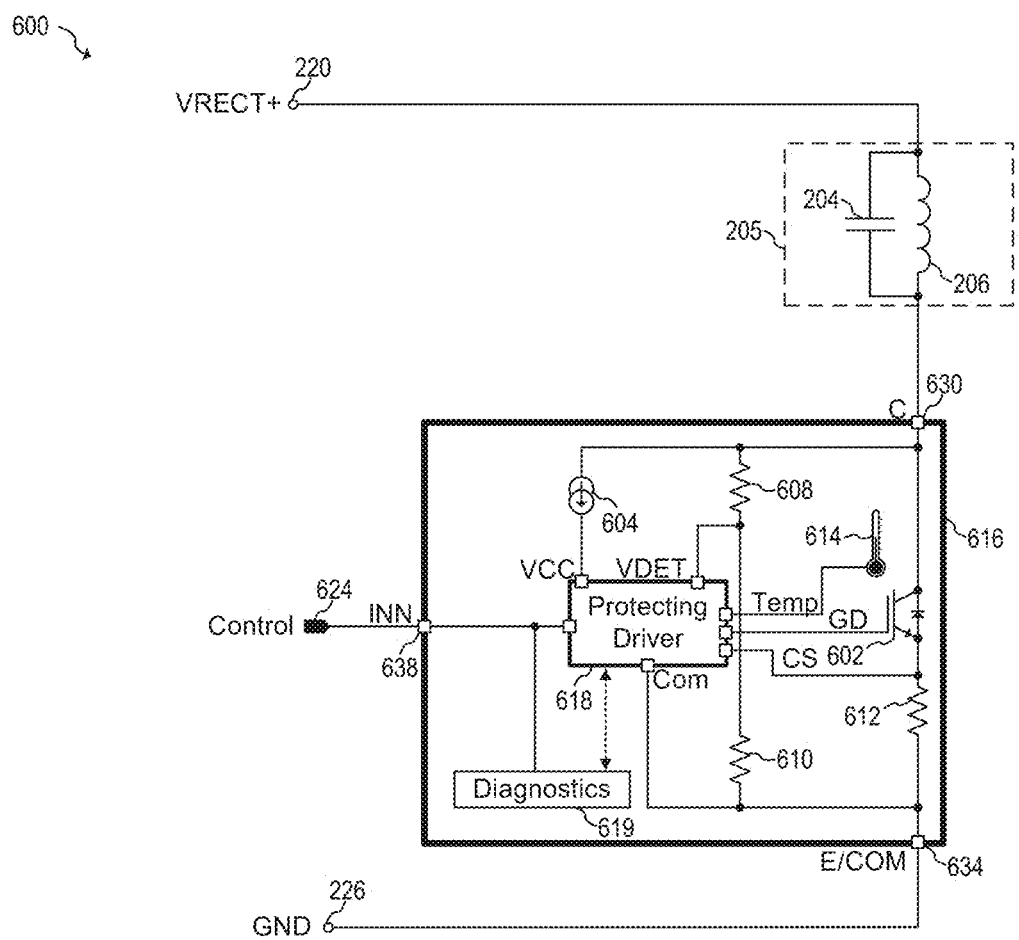
FIG. 6 shows a protected IGBT in an IH cooker subsystem, according to another embodiment of the present invention.

FIG. 6 shows protected IGBT 616 in IH cooker subsystem 600, according to an embodiment of the present invention. Protected IGBT 616 operates in a similar manner as protected IGBT 216. Protected IGBT 616, however, integrates resistors 608 and 610, sense resistor 612 and further includes power source 604 to provide power to protecting driver 618. Protected IGBT 616, therefore, may be integrated in conventional transistor packages, such as a conventional 3-pin package.

Figure 7A:
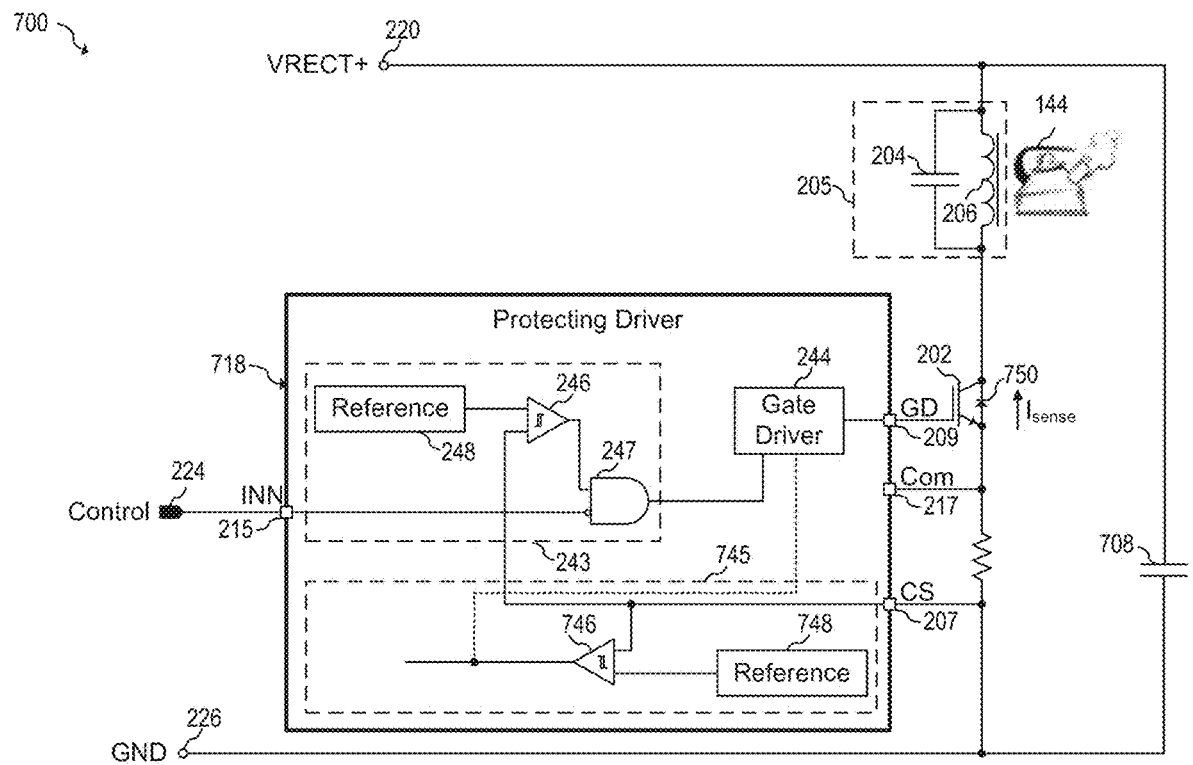
FIG. 7a shows a protecting driver in an IH cooker subsystem, according to an embodiment of the present invention.

It is possible to detect when a load, such as a cooking vessel, is removed from the cooking surface. For example, FIG. 7a shows protecting driver 718 in IH cooker subsystem 700, according to an embodiment of the present invention. Protecting driver 718 behaves in a similar manner as protecting driver 218. Protecting driver 718, however, includes removal detection circuit 745 for detecting when load 144 is removed from the cooking surface.

Detecting that load 144 has been removed from the cooking surface may be achieved by monitoring current $I_{sense}$ flowing through diode 750. During normal operation, the current flowing through diode 750 is very small or zero. For example, when load 144 is proximate to the cooking surface and IGBT 202 is on, current typically flows through the load path of IGBT 202 towards ground. When IGBT 202 turns off, diode 750 is typically reversed biased and therefore would exhibit little or no current. When load 144 is removed from the cooking surface, the load is no longer proximate to resonant inductor 206. When IGBT 202 turns off when load 144 is removed from the cooking surface, there would be little or no transfer of energy from resonant inductor 206 to load 144. Capacitor 204, therefore, may be charged to a higher peak voltage compared to the peak voltage of resonant capacitor 204 before load 144 was removed from the cooking surface. The higher voltage of resonant capacitor 204 may cause the current flowing through resonant inductor 206 when charging capacitor 708 to be higher than before load 144 was removed from the cooking surface. Diode 750, therefore, may be forward biased as a result of removing load 144 from the cooking surface, thereby conducting a current.

Current $I_{sense}$ flowing through diode 750 may be sensed by measuring a voltage across sense resistor 212. Comparator 746 may be used to compare the voltage sensed at CS terminal 207 with a reference voltage generated by reference voltage generator 748. Comparator 746 effectively senses the voltage across sense resistor 212 because comparator 746 is referenced to Com terminal 217. When the current sensed is above a first threshold, such as 50 A, a load removal event is detected. Based on the load removal event, IGBT 202 may be turned off. Other actions may be taken upon detecting a load removal event.

The threshold current for detecting a load removal may vary, for example, based on the size of the load, the material, the amount of power being transferred to the load, and the distance between the load and the resonant inductor. It is understood that the threshold may be adjusted to other current values, such as 20 A, or 100 A. the threshold current for detecting load removal may also be adjusted dynamically. For example, a lower threshold current may be used when low power is being transferred to load 144.

Figure 7B:
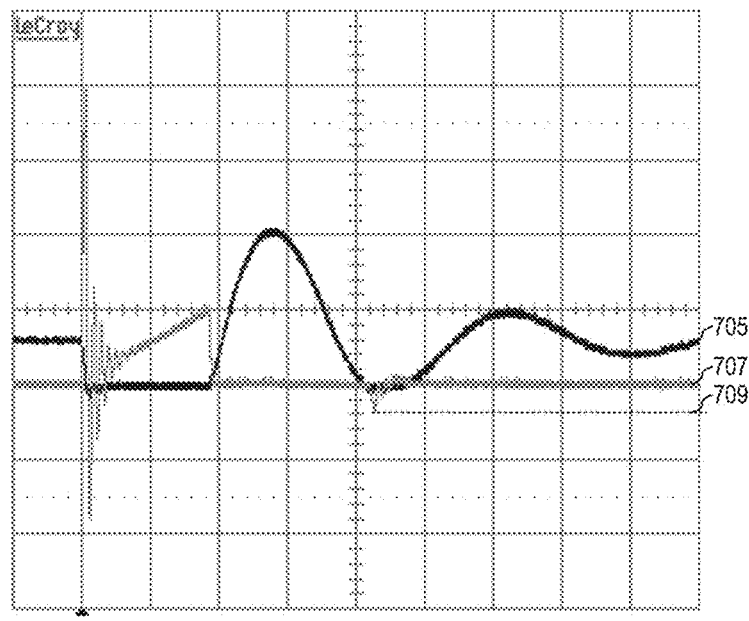
FIGS. 7b and 7c show single pulse waveforms of the current flowing through a diode before and after removal of a cooking vessel from a PCB setup emulating a cooking surface, respectively, according to an embodiment of the present invention.
Figure 7C:
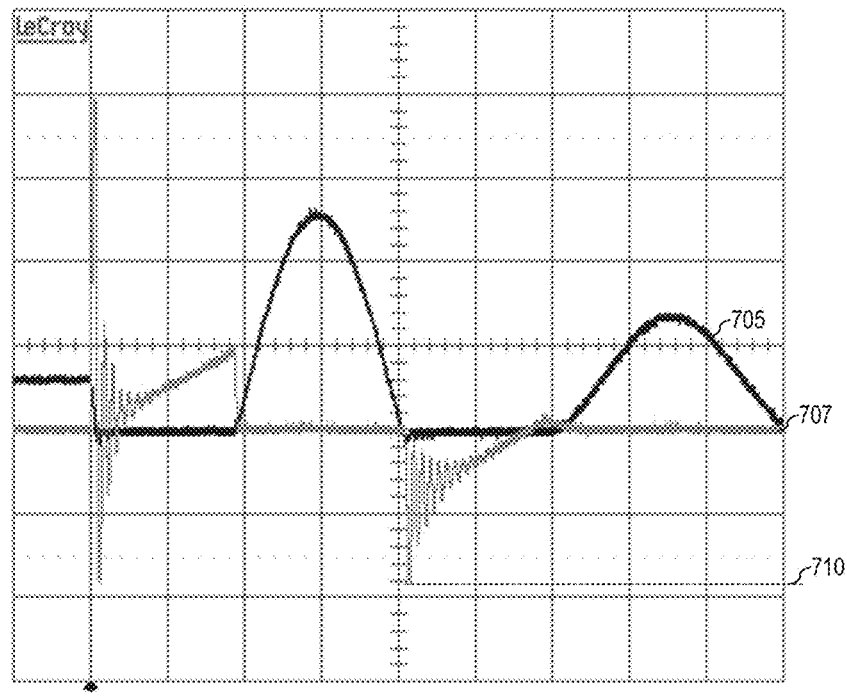

FIGS. 7b and 7c show single pulse waveforms of the current flowing through diode 750 before and after removal of a cooking vessel from a PCB setup emulating a cooking surface, respectively, according to an embodiment of the present invention. In particular, the waveforms of FIGS. 7b and 7c relate to an embodiment in which the PCB setup emulating the cooking surface delivered 2.1 kW of output power with a switching frequency of 20 kHz. The cooking vessel is a stainless steel kettle. The current scale of FIGS. 7b and 7c is 50 A per division. Curve 705 illustrates the $V_{ce}$ of IGBT 202 show. Curve 709 illustrates the current flowing through diode 750. Curves 709 and 710 illustrate the maximum peak current of diode 750 before and after removal of a cooking vessel from the cooking surface, respectively.

As shown by FIGS. 7b and 7c, the peak current flowing through diode 750 substantially increases after removal of the cooking vessel. For example, the peak current flowing through diode 750 before the cooking vessel is removed reaches about 20 A, as shown by curve 709. The peak current flowing through diode 750 after the cooking vessel is removed reaches about 90 A, as shown by curve 710.

Figure 7D:
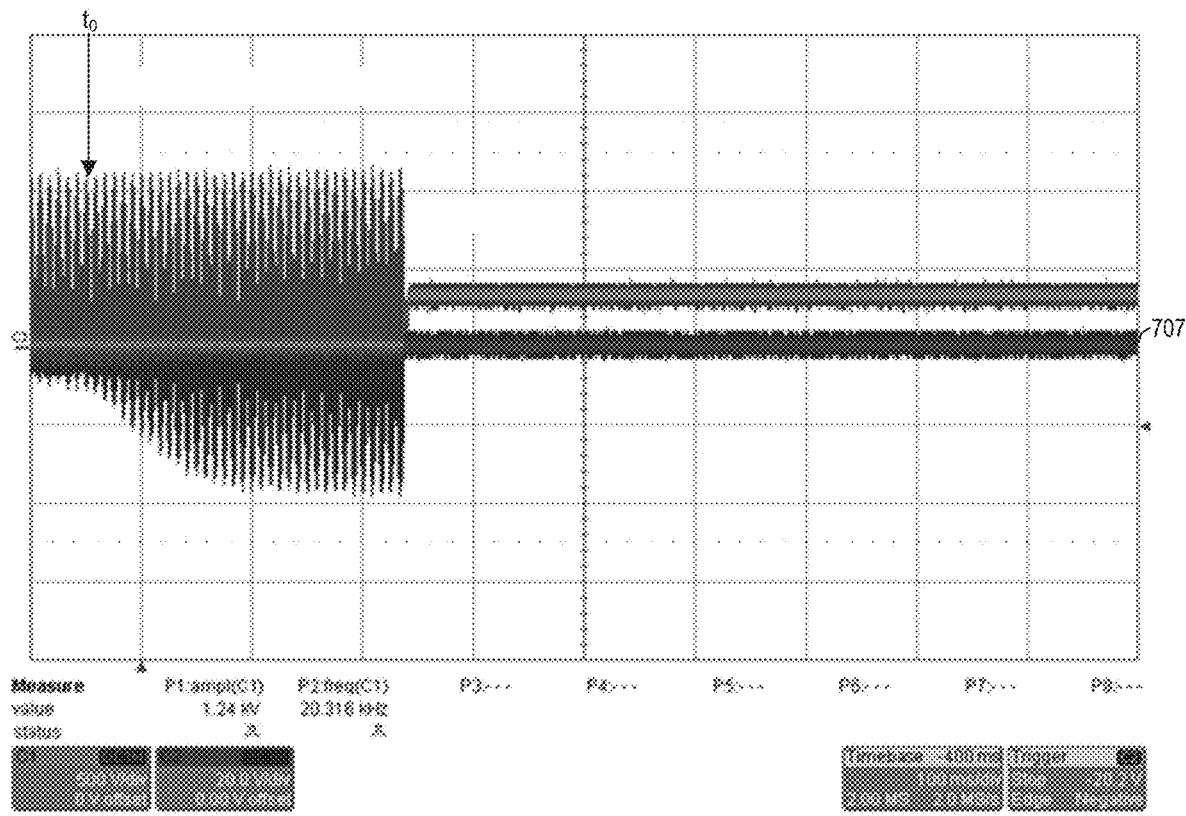
FIG. 7d shows waveforms of current flowing through a diode before and after removal of a cooking vessel from the cooking surface, according to another embodiment of the present invention.

FIG. 7d shows a zoomed-out version of the current flowing through diode 750 before and after removal of a cooking vessel from a cooking surface, according to an embodiment of the present invention. In particular, the waveforms of FIGS. 7b and 7c relate to an embodiment in which the cooktop system delivered 2.1 kW of output power with a switching frequency of 20 kHz. The cooking vessel is a stainless steel kettle. The current scale of FIG. 7d is 20 A per division. As shown in FIG. 7d, the cooking vessel is removed from the cooking surface at time $t_o$. At that point, the peak current flowing through diode 750 begins increasing, as shown by curve 707.

Example embodiments of the present invention are summarized here. Other embodiments can also be understood from the entirety of the specification and the claims filed herein.

Example 1

A method of operating a transistor including: switching the transistor on and off based on a control signal; monitoring a voltage of a collector node of the transistor; detecting whether the voltage of the collector node of the transistor is above a first threshold; and after detecting the voltage of the collector node of the transistor above the first threshold, regulating a voltage across a load path of the transistor to a first target voltage.

Example 2

The method of example 1, where regulating the voltage across the load path of the transistor includes: monitoring the voltage of the collector node of the transistor; and adjusting the voltage across the load path of the transistor based on the monitored voltage of the collector node of the transistor.

Example 3

The method of one of examples 1 or 2, where the transistor includes an insulated gate bipolar transistor (IGBT).

Example 4

The method of one of examples 1 to 3, further including regulating the voltage across the load path of the transistor to a second target voltage a first period of time after detecting the voltage of the collector node of the transistor is above the first threshold.

Example 5

The method of one of examples 1 to 4, further including: monitoring a current flowing through a load path of the transistor; and when the current flowing through the load path of the transistor is above a second threshold, turning off the transistor.

Example 6

The method of one of examples 1 to 5, where switching the transistor further includes: receiving the control signal at a control terminal; when the control terminal is below a second threshold, turning on the transistor; and when the control terminal is floating, pulling up the control terminal to a first voltage.

Example 7

The method of one of examples 1 to 6, further including: determining whether a fault condition has occurred in the transistor; and determining the first voltage based on whether the fault condition has occurred.

Example 8

The method of one of examples 1 to 7, further including heating a cooking vessel by switching the transistor on and off.

Example 9

The method of one of examples 1 to 8, further including: monitoring a diode current flowing through a diode coupled across a load path of the transistor; and detecting a removal event when the diode current is above a predetermined diode current threshold.

Example 10

A circuit including a protecting driver including: a gate driver configured to be coupled to a transistor and configured to switch the transistor on and off based on a control signal; an overvoltage detection circuit configured to monitor a voltage of a collector node of the transistor, detect whether the voltage of the collector node of the transistor is above a first threshold; and a regulator circuit configured to regulate a voltage across a load path of the transistor to a first target voltage after the overvoltage detection circuit detects the voltage of the collector node of the transistor is above the first threshold.

Example 11

The circuit of example 10, where the regulator circuit adjusts the voltage across the load path of the transistor based on the monitored voltage of the collector node of the transistor.

Example 12

The circuit of one of examples 10 or 11, further including the transistor.

Example 13

The circuit of one of examples 9 to 12, where the transistor includes an insulated gate bipolar transistor (IGBT).

Example 14

The circuit of one of examples 9 to 13, further including an induction coil coupled to the load path of the transistor.

Example 15

The circuit of one of examples 9 to 14, where the regulator circuit is further configured to regulate the voltage across the load path of the transistor to a second target voltage a first period of time after the overvoltage detection circuit detects the voltage of the collector node of the transistor is above the first threshold.

Example 16

The circuit of one of examples 9 to 15, where the second target voltage is higher than the first target voltage.

Example 17

The circuit of one of examples 9 to 16, where the protecting driver further includes a current limiter circuit configured to turn off the transistor when a current flowing through a load path of the transistor has a magnitude above a second threshold.

Example 18

The circuit of one of examples 9 to 17, where the current limiter circuit includes a comparator having a first input coupled to a reference voltage and a second input coupled to an emitter node of the transistor via a sense resistor; and the protecting driver has a common reference node coupled to an intermediate node, the intermediate node coupled between the emitter node of the transistor and the sense resistor.

Example 19

The circuit of one of examples 9 to 17, where the current limiter circuit includes a comparator having a first input coupled to a positive reference voltage and a second input coupled to an emitter node of the transistor; and the protecting driver has a common reference node coupled to the emitter node of the transistor via a sense resistor.

Example 20

An integrated circuit including: an insulated gate bipolar transistor (IGBT); a temperature sensor; and a protecting driver including a gate driver coupled to a gate of the IGBT, a current limiter circuit coupled to the gate driver, and an overvoltage protection circuit coupled to the gate of the IGBT.

Example 21

The integrated circuit of example 20, where the integrated circuit is packaged in a 6-pin package.

Example 22

The integrated circuit of example 20, where the integrated circuit is packaged in a 3-pin package.

Example 23

The integrated circuit of one of examples 19 to 22, further including a diagnostic circuit configured to: apply a first voltage to an input pin when the IGBT is off and no fault is detected, and apply a second voltage to the input pin when the IGBT is off and a fault is detected, wherein the input pin is coupled to the gate driver, the second voltage being different than the first voltage.

Example 24

The integrated circuit of one of examples 19 to 23, where the overvoltage protection circuit includes: a first comparator having a first input coupled to a first reference voltage and a second input coupled to a collector node of the IGBT; a first switch coupled between an output of the gate driver and the gate of the IGBT; a regulation circuit configured to regulate a voltage of the collector node to a target collector voltage and coupled between the collector node of the IGBT and the gate of the IGBT; and a second switch coupled between the regulation circuit and the gate of the IGBT, where the first switch is configured to open when an output of the first comparator is in a first state, and the second switch is configured to close when the output of the first comparator is in the first state.

Example 25

The integrated circuit of one of examples 19 to 24, where the regulation circuit includes a proportional integral (PI) controller.

Example 26

The integrated circuit of one of examples 19 to 24, where the regulation circuit includes an operational transconductance amplifier (OTA).

Example 27

The integrated circuit of one of examples 19 to 26, where the target collector voltage is based on a voltage produced by a reference voltage generator.

Example 28

The integrated circuit of one of examples 19 to 27, where the reference voltage generator produces a first voltage when an overvoltage condition is detected, and a second voltage a first period of time after the overvoltage condition is detected.

Example 29

The integrated circuit of one of examples 19 to 28, where the second voltage is higher than the first voltage.

Example 30

The integrated circuit of one of examples 19 to 29, where the current limiter circuit includes a second comparator having a first input coupled to a second reference voltage, a second input configured to be coupled to an emitter node of the IGBT via a sense resistor, and an output coupled to the gate driver.

Example 31

The integrated circuit of of one of examples 19 to 30, further including the sense resistor.

Example 32

The integrated circuit of one of examples 19 to 31, where the current limiter circuit includes: a first comparator configured to sense a current flowing through a load path of the IGBT, the first comparator configured to turn off the IGBT when the sensed current is above a predetermined threshold.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a transistor comprising:
   switching the transistor on and off based on a control signal;
   monitoring a voltage of a collector node of the transistor;
   detecting whether the voltage of the collector node of the transistor is above a first threshold; and
   after detecting the voltage of the collector node of the transistor above the first threshold, regulating the voltage of the collector node to a first target voltage, wherein regulating the voltage comprises using a feedback controller in a closed-loop configuration.

2. The method of claim 1, wherein the regulating the voltage of the collector node of the transistor comprises:
   monitoring the voltage of the collector node of the transistor; and
   adjusting the voltage of the collector node of the transistor based on the monitored voltage of the collector node of the transistor.

3. The method of claim 1, wherein the transistor comprises an insulated gate bipolar transistor (IGBT).

4. The method of claim 1, further comprising regulating the voltage of the collector node of the transistor to a second target voltage a first period of time after detecting the voltage of the collector node of the transistor is above the first threshold.

5. The method of claim 1, further comprising:
   monitoring a current flowing through a load path of the transistor; and
   when the current flowing through the load path of the transistor is above a second threshold, turning off the transistor.

6. The method of claim 1, wherein the switching the transistor further comprises:
   receiving the control signal at a control terminal;
   when the control terminal is below a second threshold, turning on the transistor; and
   when the control terminal is floating, pulling up the control terminal to a first voltage.

7. The method of claim 6, further comprising:
   determining whether a fault condition has occurred in the transistor; and
   determining the first voltage based on whether the fault condition has occurred.

8. The method of claim 1, further comprising heating a cooking vessel by switching the transistor on and off.

9. The method of claim 1, further comprising:
   monitoring a diode current flowing through a diode coupled across a load path of the transistor; and
   detecting a removal event when the diode current is above a predetermined diode current threshold.

10. The method of claim 1, wherein the feedback controller comprises a PI controller.

11. The method of claim 1, wherein the feedback controller comprises an operational transconductance amplifier.

12. A protection circuit comprising a protecting driver comprising:
    a gate driver configured to be coupled to a transistor and configured to switch the transistor on and off based on a control signal;
    an overvoltage detection circuit configured to
       monitor a voltage of a collector node of the transistor,
       detect whether the voltage of the collector node of the transistor is above a first threshold; and
    a regulator circuit configured to regulate the voltage of the collector node of the transistor to a first target voltage after the overvoltage detection circuit detects the voltage of the collector node of the transistor is above the first threshold, wherein the regulator circuit comprises a feedback controller configured to operate in a closed-loop configuration during regulation.

13. The protection circuit of claim 12, wherein the regulator circuit adjusts the voltage of the collector node of the transistor based on the monitored voltage of the collector node of the transistor.

14. The protection circuit of claim 12, further comprising the transistor.

15. The protection circuit of claim 14, wherein the transistor comprises an insulated gate bipolar transistor (IGBT).

16. The protection circuit of claim 15, further comprising an induction coil coupled to a load path of the transistor.

17. The protection circuit of claim 12, wherein the regulator circuit is further configured to regulate the voltage of the collector node of the transistor to a second target voltage a first period of time after the overvoltage detection circuit detects the voltage of the collector node of the transistor is above the first threshold.

18. The protection circuit of claim 17, wherein the second target voltage is higher than the first target voltage.

19. The protection circuit of claim 12, wherein the protecting driver further comprising a current limiter circuit configured to turn off the transistor when a current flowing through a load path of the transistor has a magnitude above a second threshold.

20. The protection circuit of claim 19, wherein
    the current limiter circuit comprises a comparator having a first input coupled to a reference voltage and a second input coupled to an emitter node of the transistor via a sense resistor; and
    the protecting driver has a common reference node coupled to an intermediate node, the intermediate node coupled between the emitter node of the transistor and the sense resistor.

21. The protection circuit of claim 19, wherein
    the current limiter circuit comprises a comparator having a first input coupled to a positive reference voltage and a second input coupled to an emitter node of the transistor; and
    the protecting driver has a common reference node coupled to the emitter node of the transistor via a sense resistor.

22. The protection circuit of claim 12, wherein the feedback controller comprises a PI controller.

23. The protection circuit of claim 12, wherein the feedback controller comprises an operational transconductance amplifier.

24. A method of operating a transistor comprising:
switching the transistor on and off based on a control signal;
monitoring a voltage of a collector node of the transistor;
detecting whether the voltage of the collector node of the transistor is above a first threshold;
after detecting the voltage of the collector node of the transistor above the first threshold, regulating the voltage of the collector node to a first target voltage;
monitoring a current flowing through a load path of the transistor; and
when the current flowing through the load path of the transistor is above a second threshold, turning off the transistor.

* * * * *